(12) United States Patent
Chen et al.

(10) Patent No.: US 10,818,583 B2
(45) Date of Patent: Oct. 27, 2020

(54) SEMICONDUCTOR DEVICES, METHODS OF MANUFACTURE THEREOF, AND SEMICONDUCTOR DEVICE PACKAGES

(71) Applicant: Taiwan Semiconductor Manufacturing Company, Ltd., Hsinchu (TW)

(72) Inventors: I-Ting Chen, Hsinchu (TW); Ying-Ching Shih, Hsinchu (TW); Po-Hao Tsai, Zhongli (TW); Szu-Wei Lu, Hsinchu (TW); Jing-Cheng Lin, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 21 days.

(21) Appl. No.: 15/714,879

(22) Filed: Sep. 25, 2017

(65) Prior Publication Data

US 2018/0012830 A1    Jan. 11, 2018

Related U.S. Application Data

(62) Division of application No. 13/753,312, filed on Jan. 29, 2013, now Pat. No. 9,773,724.

(51) Int. Cl.
*H01L 23/498* (2006.01)
*H01L 21/768* (2006.01)
(Continued)

(52) U.S. Cl.
CPC .. *H01L 23/49811* (2013.01); *H01L 21/76885* (2013.01); *H01L 24/11* (2013.01); *H01L 24/13* (2013.01); *H01L 24/14* (2013.01); *H01L 24/16* (2013.01); *H01L 24/17* (2013.01); *H01L 24/81* (2013.01); *H01L 25/50* (2013.01); *H01L 24/03* (2013.01); *H01L 24/05* (2013.01); *H01L 2224/0345* (2013.01); *H01L 2224/0348* (2013.01); *H01L 2224/03912* (2013.01);
(Continued)

(58) Field of Classification Search
CPC ... H01L 2223/54426; H01L 2924/3511; H01L 2924/3512; H01L 2924/35121; H01L 23/544; H01L 2224/757; H01L 2224/8012; H01L 2224/8112; H01L 2224/9512; H01L 21/68; H01L 2021/60067; H01L 2225/06593; H01L 2225/1082; H01L 2224/10125; H01L 2224/10126; H01L 2224/10135; H01L 2224/10155; H01L 2224/10156; H01L 2224/10165; H01L 2224/11013; H01L 2224/11015

See application file for complete search history.

(56) References Cited

U.S. PATENT DOCUMENTS 4,836,435 A    6/1989    Napp et al.
5,329,423 A    7/1994    Scholz
(Continued)

*Primary Examiner* — David A Zarneke
(74) *Attorney, Agent, or Firm* — Slater Matsil, LLP

(57) ABSTRACT

Semiconductor devices, methods of manufacture thereof, and semiconductor device packages are disclosed. In one embodiment, a semiconductor device includes an insulating material layer having openings on a surface of a substrate. One or more insertion bumps are disposed over the insulating material layer. The semiconductor device includes signal bumps having portions that are not disposed over the insulating material layer.

20 Claims, 14 Drawing Sheets

(51) Int. Cl.
    *H01L 23/00*   (2006.01)
    *H01L 25/00*   (2006.01)

(52) U.S. Cl.
    CPC .............. *H01L 2224/0401* (2013.01); *H01L 2224/0508* (2013.01); *H01L 2224/05166* (2013.01); *H01L 2224/05647* (2013.01); *H01L 2224/06102* (2013.01); *H01L 2224/10126* (2013.01); *H01L 2224/1146* (2013.01); *H01L 2224/1148* (2013.01); *H01L 2224/1161* (2013.01); *H01L 2224/11474* (2013.01); *H01L 2224/11618* (2013.01); *H01L 2224/11622* (2013.01); *H01L 2224/131* (2013.01); *H01L 2224/13013* (2013.01); *H01L 2224/13014* (2013.01); *H01L 2224/13017* (2013.01); *H01L 2224/1319* (2013.01); *H01L 2224/13019* (2013.01); *H01L 2224/13022* (2013.01); *H01L 2224/13082* (2013.01); *H01L 2224/13084* (2013.01); *H01L 2224/13147* (2013.01); *H01L 2224/13166* (2013.01); *H01L 2224/13187* (2013.01); *H01L 2224/16145* (2013.01); *H01L 2224/16225* (2013.01); *H01L 2224/16227* (2013.01); *H01L 2224/16237* (2013.01); *H01L 2224/16238* (2013.01); *H01L 2224/1701* (2013.01); *H01L 2224/17051* (2013.01); *H01L 2224/17517* (2013.01); *H01L 2224/81141* (2013.01); *H01L 2224/81193* (2013.01); *H01L 2224/81815* (2013.01); *H01L 2225/06513* (2013.01); *H01L 2225/06517* (2013.01); *H01L 2225/06541* (2013.01); *H01L 2225/06565* (2013.01); *H01L 2924/01322* (2013.01); *H01L 2924/12042* (2013.01); *H01L 2924/15311* (2013.01); *H01L 2924/3511* (2013.01)

(56) References Cited

U.S. PATENT DOCUMENTS

| | | | | |
|---|---|---|---|---|
| 5,523,628 | A | 6/1996 | Williams et al. | |
| 5,530,375 | A | 6/1996 | Seidel | |
| 6,016,060 | A * | 1/2000 | Akram | G01R 1/0466 324/754.08 |
| 6,410,861 | B1 | 6/2002 | Huang et al. | |
| 6,512,298 | B2 | 1/2003 | Sahara et al. | |
| 6,613,662 | B2 | 9/2003 | Wark et al. | |
| 6,643,434 | B2 * | 11/2003 | Cayrefourcq | G02B 6/4232 257/777 |
| 6,650,016 | B1 * | 11/2003 | MacQuarrie | H01L 21/485 228/180.22 |
| 6,677,677 | B2 | 1/2004 | Kimura et al. | |
| 6,724,084 | B1 | 4/2004 | Hikita et al. | |
| 6,756,540 | B2 | 6/2004 | Hedler et al. | |
| 6,830,463 | B2 * | 12/2004 | Keller | H01L 23/49827 257/E23.067 |
| 6,946,732 | B2 | 9/2005 | Akram et al. | |
| 7,045,900 | B2 | 5/2006 | Hikita et al. | |
| 7,099,525 | B2 * | 8/2006 | Bakir | G02B 6/12002 385/14 |
| 7,129,586 | B2 | 10/2006 | Kashiwazaki | |
| 7,135,771 | B1 * | 11/2006 | Khandekar | H01L 24/81 257/737 |
| 7,135,777 | B2 * | 11/2006 | Bakir | G01R 1/0491 257/773 |
| 7,361,990 | B2 | 4/2008 | Lu et al. | |
| 7,368,817 | B2 | 5/2008 | Pendse | |
| 7,405,478 | B2 * | 7/2008 | Ishikawa | H01L 24/11 257/737 |
| 7,468,558 | B2 * | 12/2008 | Bakir | G01R 1/0491 257/773 |
| 7,479,402 | B2 | 1/2009 | Yu | |
| 7,479,702 | B2 * | 1/2009 | Uang | B82Y 10/00 257/723 |
| 7,781,867 | B2 * | 8/2010 | Lee | H01L 24/81 257/618 |
| 7,893,550 | B2 | 2/2011 | Shin et al. | |
| 8,044,475 | B2 * | 10/2011 | Lin | H01L 27/14618 257/432 |
| 8,076,785 | B2 | 12/2011 | Nishimura et al. | |
| 8,115,319 | B2 * | 2/2012 | Hsu | H01L 23/544 257/737 |
| 8,164,186 | B2 | 4/2012 | Watanabe et al. | |
| 8,232,643 | B2 | 7/2012 | Chuang et al. | |
| 8,304,339 | B2 | 11/2012 | Lin | |
| 8,415,792 | B2 * | 4/2013 | West | H01L 23/49816 257/737 |
| 8,487,428 | B2 * | 7/2013 | Lee | H01L 23/10 174/545 |
| 8,653,657 | B2 | 2/2014 | Miyata et al. | |
| 8,659,161 | B2 * | 2/2014 | Krishnamoorthy | H01L 24/81 257/686 |
| 8,912,649 | B2 * | 12/2014 | Wu | H01L 23/3171 257/737 |
| 8,928,133 | B2 * | 1/2015 | Baskaran | H01L 24/16 156/91 |
| 9,111,443 | B2 * | 8/2015 | Lynar | G08G 1/0112 |
| 9,111,943 | B2 * | 8/2015 | Chow | H01L 23/544 |
| 9,219,047 | B2 * | 12/2015 | Motoyoshi | H01L 24/11 |
| 9,548,290 | B2 * | 1/2017 | Wakiyama | H01L 27/1464 |
| 9,737,551 | B2 | 8/2017 | Andrali et al. | |
| 10,217,718 | B1 * | 2/2019 | Lam | H01L 24/97 |
| 2001/0031548 | A1 | 10/2001 | Elenius et al. | |
| 2003/0060035 | A1 * | 3/2003 | Kimura | H01L 23/50 438/626 |
| 2005/0012212 | A1 | 1/2005 | Gilleo | |
| 2005/0104222 | A1 * | 5/2005 | Jeong | H01L 23/16 257/778 |
| 2006/0177965 | A1 * | 8/2006 | Senda | H01L 24/29 438/108 |
| 2006/0202519 | A1 | 9/2006 | Latimer, III et al. | |
| 2007/0148818 | A1 | 6/2007 | Williams et al. | |
| 2008/0142964 | A1 * | 6/2008 | Sun | H01L 24/11 257/737 |
| 2009/0121302 | A1 | 5/2009 | Lin et al. | |
| 2009/0127704 | A1 | 5/2009 | Lee | |
| 2009/0127705 | A1 | 5/2009 | Miyata et al. | |
| 2011/0095418 | A1 | 4/2011 | Lim et al. | |
| 2011/0193228 | A1 * | 8/2011 | Yu | H01L 21/563 257/738 |
| 2011/0227200 | A1 * | 9/2011 | Chow | H01L 23/544 257/618 |
| 2012/0001329 | A1 * | 1/2012 | Kim | H01L 24/14 257/738 |
| 2012/0032321 | A1 * | 2/2012 | West | H01L 23/49816 257/737 |
| 2012/0049350 | A1 * | 3/2012 | Grillberger | H01L 21/4853 257/737 |
| 2012/0129330 | A1 * | 5/2012 | Kim | H01L 21/28176 438/613 |
| 2012/0129333 | A1 * | 5/2012 | Yim | H01L 24/11 438/591 |
| 2012/0319289 | A1 * | 12/2012 | Mori | H01L 24/14 257/773 |
| 2012/0326322 | A1 * | 12/2012 | Krishnamoorthy | H01L 24/13 257/773 |
| 2013/0026620 | A1 * | 1/2013 | Huang | H01L 23/49811 257/737 |
| 2013/0043583 | A1 | 2/2013 | Wu et al. | |
| 2013/0119536 | A1 | 5/2013 | Hada et al. | |
| 2013/0134606 | A1 | 5/2013 | Im et al. | |
| 2013/0244382 | A1 | 9/2013 | Clark | |
| 2013/0313726 | A1 | 11/2013 | Uehling | |
| 2014/0027900 | A1 * | 1/2014 | Chiu | C23C 18/42 257/737 |
| 2015/0049450 | A1 | 2/2015 | Okamoto et al. | |

(56) References Cited

U.S. PATENT DOCUMENTS

2015/0076689 A1    3/2015  Huang et al.
2017/0179062 A1*   6/2017  Jang ..................... H01L 23/481

* cited by examiner

SEMICONDUCTOR DEVICES, METHODS OF MANUFACTURE THEREOF, AND SEMICONDUCTOR DEVICE PACKAGES

PRIORITY CLAIM AND CROSS-REFERENCE

This patent application is a divisional of U.S. application Ser. No. 13/753,312, filed Jan. 29, 2013, entitled "Semiconductor Devices, Methods of Manufacture Thereof, and Semiconductor Device Packages." which relates to the following commonly assigned U.S. application Ser. No. 13/192,756, filed on Jul. 28, 2011, entitled, "Self-aligning Conductive Bump Structure and Method of Making the Same," now U.S. Pat. No. 9,024,438, issued May 5, 2015, which applications are hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately or together with other individual dies.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One type of smaller packaging for semiconductor devices that has been developed is wafer level packaging (WLPs). Flip-chip bonding utilizes conductive bumps to establish electrical contact between contact pads of an integrated circuit die and a packaging substrate.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to semiconductor devices and packaging of semiconductor devices. Novel semiconductor devices, methods of manufacture thereof, and semiconductor device packages will be described herein.

Figure 1:
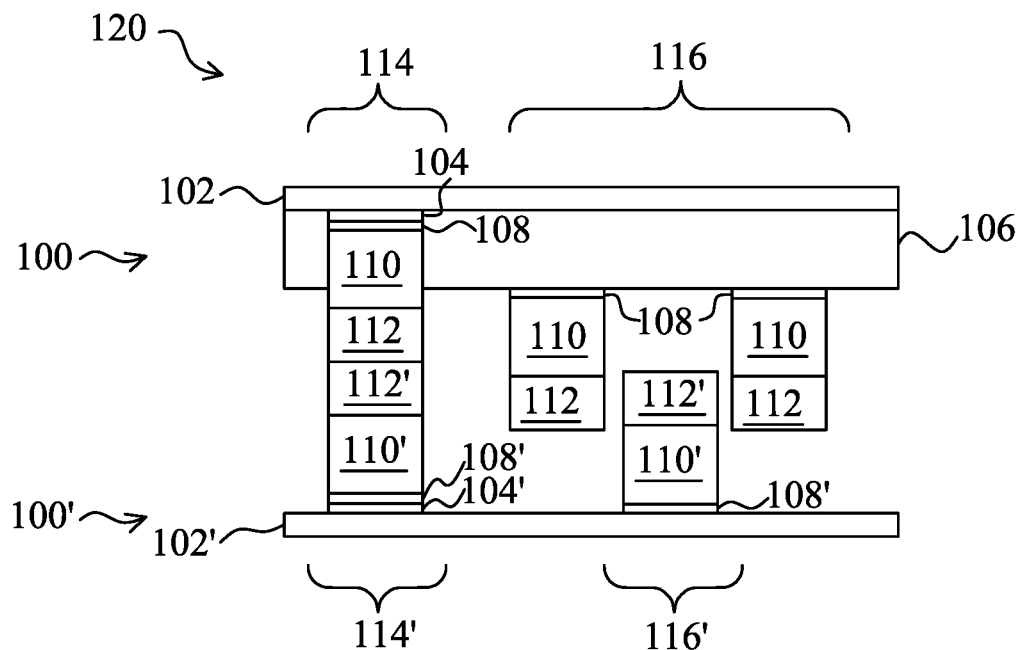
FIG. 1 is a cross-sectional view of a semiconductor device that includes signal bumps and insertion bumps in accordance with some embodiments of the present disclosure.

FIG. 1 is a cross-sectional view of a semiconductor device 100 that includes a plurality of conductive bumps 114/116 disposed over a surface of a substrate 102. The plurality of conductive bumps 114/116 comprises microbumps, controlled collapse chip connection (C4) bumps, or other types of electrical contacts, as examples. The plurality of conductive bumps 114/116 comprises a plurality of signal bumps 114 and one or more insertion bumps 116 in accordance with some embodiments of the present disclosure. The insertion bumps 116 are formed over an insulating material layer 106 having openings that is disposed on a surface of the substrate 102 in accordance with some embodiments of the present disclosure. The signal bumps 114 at least have portions that are not disposed over the insulating material 106. For example, the signal bumps 114 are not formed over the insulating material layer 106 in the embodiment shown. The semiconductor device 100 is packaged with another semiconductor device 100' to form a semiconductor device package 120. The semiconductor devices 100 and 100' may comprise integrated circuit dies, packaging devices, packaging substrates, or other types of substrates.

The signal bumps 114 are formed over contact pads 104 on a substrate 102. The signal bumps 114 include a seed layer 108, a conductive material 110, and a cap layer 112, to be described further herein. The insertion bumps 116 include the seed layer 108, the conductive material 110, and the cap layer 112. Only one signal bump 114 and two insertion bumps 116 are shown in FIG. 1; however, in accordance with some embodiments, a plurality of signal bumps 114 is formed across a surface of the substrate 102, and one or more insertion bumps 116 are formed across the surface of the substrate 102. The signal bumps 114 may be arranged in an array, in a random arrangement, in one or more rows on one or more edges of the substrate 102, or other configurations. One or more insertion bumps 116 may be placed at one or more edges of the substrate 102, in a central region of the substrate 102, or other regions of the substrate 102. In some embodiments, one or more insertion bumps 116 are placed in three or more regions of the substrate 102, as another example. The one or more insertion bumps 116 may be placed around a central region of the substrate 102, around die edge, or in a corner region of the substrate 102 or a die, as other examples.

Semiconductor device 100' includes a substrate 102' including signal bumps 114' and insertion bumps 116' formed thereon. The insertion bumps 116' of the semiconductor device 100' are not formed on an insulating material layer: the insertion bumps 116' are formed directly on the substrate 102'. The signal bumps 114' are formed on contact pads 104' on the substrate 102', and the signal bumps 114' include a seed layer 108', a conductive material 110', and a cap layer 112'. The insertion bumps 116 include the seed layer 108', the conductive material 110', and the cap layer 112'. In some embodiments, at least portions of the semiconductor device 100' can be manufactured using a method described in U.S. patent application Ser. No. 13/192,756, filed on Jul. 28, 2011, entitled, "Self-aligning Conductive Bump Structure and Method of Making the Same," which is incorporated herein by reference, as an example. Alternatively, the semiconductor device 100' may be formed using other methods.

The insertion bumps 116 and 116' of semiconductor device 100 and semiconductor device 100', respectively, advantageously provide mechanical registration and alignment during the coupling of the two semiconductor devices 100 and 100' together to form a semiconductor device package 120. The insulating material layer 106 of the semiconductor device 100 creates an overlap of the insertion bumps 116 and 116'. In some embodiments, the cap layers 112 and 112' of the signal bumps 114 and 114', respectively, comprise solder or other type of eutectic material that is re-flowed to attach the semiconductor device 100 to semiconductor device 100'. The insertion bumps 116 and 116' maintain the correct alignment of the signal bumps 114 and 114' during the solder re-flow process, advantageously.

In some embodiments, a cap layer 112 is included on the signal bumps 114 and insertion bumps 116 of semiconductor device 100, but a cap layer 112' is not included on the signal bumps 114' and insertion bumps 116' of semiconductor device 100'. In other embodiments, a cap layer 112' is included on the signal bumps 114' and insertion bumps 116' of semiconductor device 100', but a cap layer 112 is not included on the signal bumps 114 and insertion bumps 116 of semiconductor device 100. At least one of the semiconductor devices 100 or 100' comprises a cap layer 112 or 112' in accordance with some embodiments, as another example.

Gaps between insertion bumps 116 and 116' from adjacent semiconductor devices 100 and 100', respectively, after mating them are no larger than about half a width of the signal bumps 114 and 114' in accordance with some embodiments of the present disclosure. Gaps between insertion bumps 116 and 116' comprising this dimension ensure that the signal bumps 114 and 114' do not slip off or become misaligned while still providing some mechanical tolerance room for some misalignment, for example. Alternatively, the gaps between the insertion bumps 116 and 116' may comprise other relative dimensions.

Figure 2A:
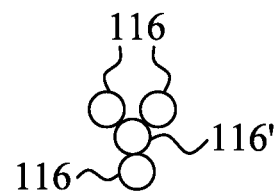
FIGS. 2a and 2b are top views of the insertion bumps shown in FIG. 1 in accordance with some embodiments.
Figure 2B:
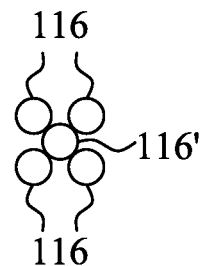

FIGS. 2a and 2b are top views of the insertion bumps 116 and 116' of semiconductor devices 100 and 100', respectively, shown in FIG. 1 in accordance with some embodiments. Semiconductor device 100 includes three or more insertion bumps 116 in accordance with some embodiments. The one or more of the insertion bumps 116 include three or more insertion bumps that form vertices of a polygon in a top view in some embodiments. One or more of the insertion bumps 116' is a plug in some embodiments.

In FIG. 2a, an arrangement of three insertion bumps 116 is illustrated. The three insertion bumps 116 are arranged around a central region, wherein the central region is disposed between the three insertion bumps 116. An insertion bump 116' of semiconductor device 100' comprises a plug shape and is adapted to fit in the central region disposed between the three insertion bumps 116 of semiconductor device 100, as shown in FIG. 2a. Alternatively, four or more insertion bumps 116 may be included proximate the insertion bump 116' of semiconductor device 100'. For example, four insertion bumps 116 arranged around a central region are shown in FIG. 2b.

The plurality of insertion bumps 116 on semiconductor device 100 comprises a receptacle shape with a hollow center, and the insertion bump 116' on semiconductor device 100' comprises a plug shape, in some embodiments. The plurality of insertion bumps 116 function as a receptacle that the insertion bump 116' is plugged into when the semiconductor devices 100 and 100' are coupled together, for example. The central region between the plurality of insertion bumps 116 comprises a hollow region of the receptacle shape.

In the embodiment shown in FIGS. 1, 2a, and 2b, a single plug-shaped insertion bump 116' is disposed on semiconductor device 100', and a plurality of insertion bumps 116 comprising a receptacle shape is disposed on semiconductor device 100. Alternatively, a single plug-shaped insertion bump 116 can be included on semiconductor device 100, and a plurality of insertion bumps 116' comprising a receptacle shape can be included on semiconductor device 100' (see FIG. 22). In accordance with some embodiments, one semiconductor device 100 or 100' includes an insertion bump 116 or 116' that functions as a plug, and the other semiconductor device 100' or 100 includes a plurality of insertion bumps 116' or 116 that function as a receptacle, for example.

Figure 3:
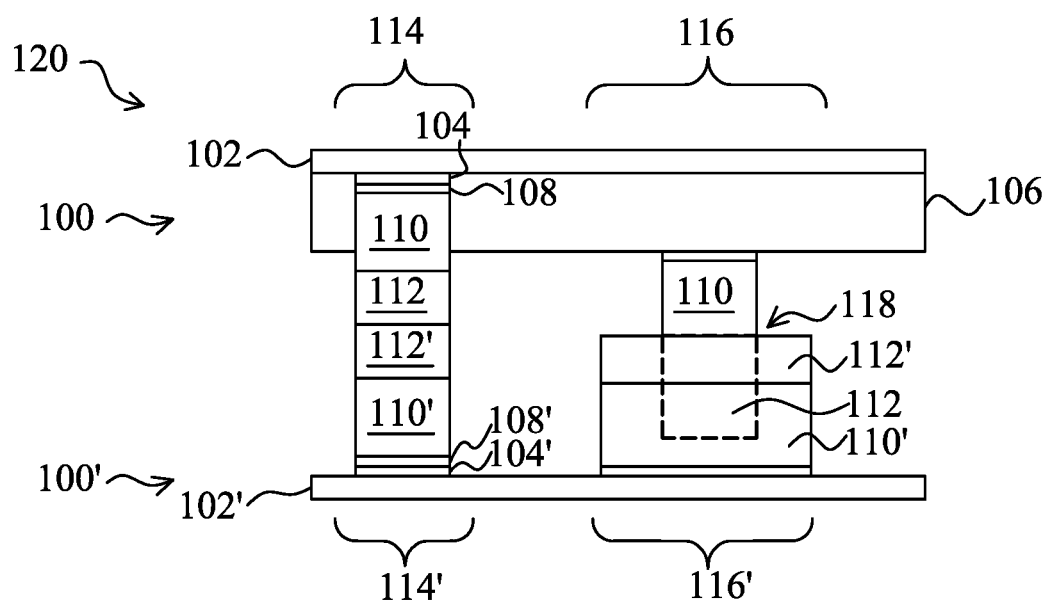
FIG. 3 is a cross-sectional view of a semiconductor device including signal bumps and insertion bumps in accordance with other embodiments of the present disclosure.

FIG. 3 is a cross-sectional view of a semiconductor device 100 including signal bumps 114 and insertion bumps 116 in accordance with other embodiments of the present disclosure. A single insertion bump 116 that functions as a plug and comprises a plug shape is disposed over an insulating material layer 106 on the substrate 102 of the semiconductor device 100. Semiconductor device 100' does not include an insulating material layer over the substrate 102'. Insertion bump 116' is formed directly over the substrate 102' and has a greater width than a width of insertion bump 116 on semiconductor device 100. The signal bump 114 and insertion bump 116 may have a width of about 5 μm to about 30 μm, and insertion bump 116' may comprise a width of about 5 μm to about 30 μm, as examples. Alternatively, the signal bump 114 and insertion bumps 116 and 116' may comprise other dimensions. Insertion bump 116' includes a hollow region or hollow center 118, comprises a receptacle shape, and is adapted to receive the plug-functioning insertion bump 116 on semiconductor device 100. Insertion bump 116 on semiconductor device 100 fits within the hollow region 118 of the insertion bump 116' on semiconductor device 100'. The hollow region 118 of the insertion bump 116' may extend completely to the substrate 102' in some embodiments. Alternatively, the hollow region 118 of the insertion bump 116' may extend to a predetermined point above the substrate 102' in other embodiments.

Figure 4A:
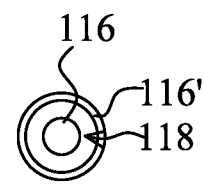
FIGS. 4a and 4b are top views of the insertion bumps shown in FIG. 3 in accordance with some embodiments.
Figure 4B:
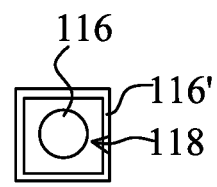

FIGS. 4a and 4b are top views of the insertion bumps 116 and 116' shown in FIG. 3 in accordance with some embodiments. Insertion bumps 116' comprise a ring shape in the top view. The insertion bumps 116' may be round, as shown in FIG. 4a, or square, as shown in FIG. 4b, in the top view. Alternatively, the insertion bumps 116' may be rectangular or may comprise other shapes.

Figure 5A:
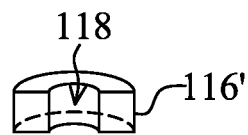
FIGS. 5a and 5b are perspective views of a portion of the insertion bumps shown in FIG. 3 in accordance with some embodiments.
Figure 5B:
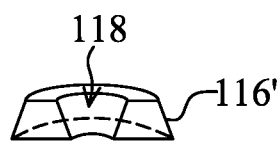

FIGS. 5a and 5b are perspective views of a portion of the insertion bumps 116' of semiconductor device 100' shown in FIG. 3 in accordance with some embodiments. The sidewalls of the insertion bumps 116' may be substantially straight, as shown in FIG. 5a, or the alternatively, the sidewalls of the insertion bumps 116' may be tapered, as shown in FIG. 5b. The sidewalls of the insertion bumps 116' may comprise a greater width proximate the substrate 102' than at a top surface of the insertion bumps 116', for example.

Figure 6:
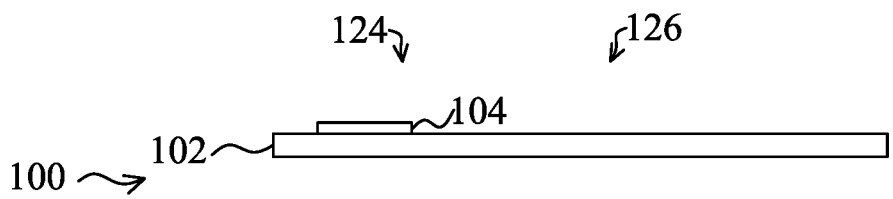
FIGS. 6 through 13 are cross-sectional views illustrating methods of manufacturing a semiconductor device in accordance with some embodiments.

Methods of manufacturing the semiconductor devices 100 shown in FIGS. 1 and 3 will next be described. FIGS. 6 through 13 are cross-sectional views illustrating methods of manufacturing a semiconductor device 100 in accordance with some embodiments. To manufacture the semiconductor device 100, first, a substrate 102 is provided, as shown in FIG. 6. The substrate 102 may include a semiconductor substrate comprising silicon or other semiconductor materials and may be covered by an insulating layer, for example. The substrate 102 may comprise an integrated circuit die that includes active components or circuits, not shown. The substrate 102 may comprise silicon oxide over single-crystal silicon, for example. The substrate 102 may include conductive layers or other semiconductor elements, e.g., transistors, diodes, capacitors, resistors, inductors, etc. Compound semiconductors, GaAs, InP, Si/Ge, or SiC, as examples, may be used in place of silicon. The substrate 102 may comprise a silicon-on-insulator (SOI) or a germanium-on-insulator (GOI) substrate, as examples. In some embodiments, the substrate 102 comprises an interposer substrate or a packaging substrate, as another example.

In the drawings, only one semiconductor device 100 is shown. However, a plurality of semiconductor devices 100 are formed on a wafer comprising a plurality of substrates 102 that may be arranged in rows and columns, for example. After manufacturing the semiconductor devices 100, or before or after packaging the semiconductor devices 100 with another semiconductor device 100 or 100', the semiconductor devices 100 are singulated along scribe lines using a saw or laser, as examples, forming individual semiconductor devices 100.

The substrate 102 includes a plurality of contact pads 104 disposed thereon, also shown in FIG. 6. The contact pads 104 may comprise an upper metallization layer or conductive line layer of the substrate 102. The contact pads 104 may comprise Al, an Al alloy, Cu, a Cu alloy, other conductive materials, or combinations or multiple layers thereof, as examples. Alternatively, the contact pads 104 may comprise other materials. Only one contact pad 104 is shown in the drawings; however, a plurality of contact pads 104 are disposed over the substrate 102 and may be arranged in an array, random patterns, one or more rows on one or more edges or a central region of the substrate 102, as examples. The contact pads 104 are coupled to underlying conductive lines, vias, or circuitry formed within the substrate 102 in some embodiments, for example. In other embodiments, one or more of the contact pads 104 may be coupled to other contact pads 104 using conductive lines formed in the same material layer the contact pads 104 are formed in, not shown.

The substrate 102 includes a signal bump region 124 in which a plurality of signal bumps 114 (not shown in FIG. 6; see signal bumps 114 in FIGS. 12 and 13) will be formed. The substrate 102 also includes an insertion bump region 126 in which a plurality of insertion bumps 116 (also not shown in FIG. 6; see insertion bumps 116 in FIGS. 12 and 13) will be formed in accordance with some embodiments. The contact pads 104 are disposed in the signal bump region 124 of the substrate 102.

Figure 7:
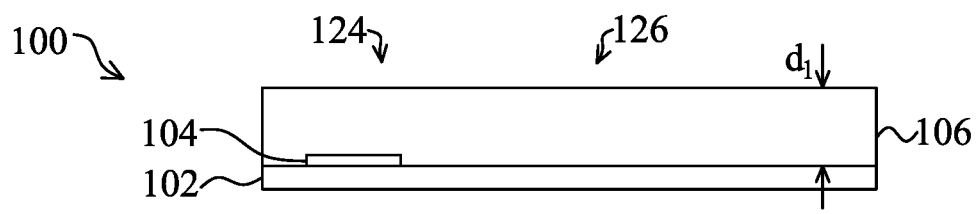

An insulating material layer 106 is formed over the contact pads 104 and the substrate 102, as shown in FIG. 7. The insulating material layer 106 comprises silicon nitride, polyimide, or polybenzoxazole (PBO), as examples, although the insulating material layer 106 may alternatively comprise other dielectric and insulating materials. The insulating material layer 106 has a thickness comprising dimension $d_1$, wherein dimension $d_1$ comprises about 5 to about 10 μm, as an example. Alternatively, dimensions $d_1$ of the insulating material layer 106 may comprise other dimensions. The insulating material layer 106 may be deposited using chemical vapor deposition (CVD), physical vapor deposition (PVD), a spin-on method, or a sputtering method, as examples. Alternatively, the insulating material layer 106 may be formed using other methods. The insulating material layer 106 is substantially conformal as deposited, as shown in FIG. 6. Alternatively, the insulating material layer 106 may conform to the topography of the substrate 102 and contact pad 104, not shown. The insulating material layer 106 is used to raise the insertion bumps 116 (not shown in FIG. 7; see FIG. 12) and form an overlap of the insertion bumps 116 with insertion bumps of another semiconductor device.

Next, the insulating material layer 106 is removed from at least a portion of the signal bump region 124 of the substrate 102. In the embodiment shown in FIGS. 6 through 12, the insulating material layer 106 is completely removed from the signal bump region 124 of the substrate 102, for example. In other embodiments, the insulating material layer 106 is removed from a portion of the signal bump region 124 of the substrate 102, to be described further herein with reference to FIGS. 24 through 29.

Figure 8:
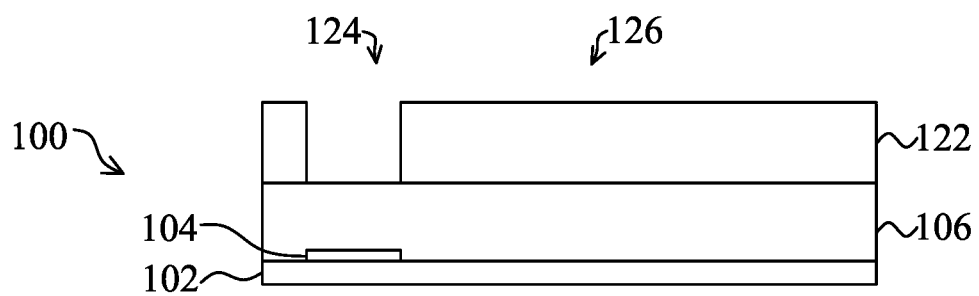

To remove the insulating material layer 106 from the signal bump region 124 of the substrate 102, a masking material 122 may be formed over the insulating material layer 106 in some embodiments, as shown in FIG. 8. The masking material 122 comprises a photoresist in some embodiments, although alternatively, other materials may be used. The masking material 122 is patterned using photolithography (e.g., by exposing the masking material 122 to energy or light transmitted through or reflected from a lithography mask having a desired pattern thereon, after which the masking material is developed), removing the masking material 122 from the signal bump region 124 of the substrate 102, also shown in FIG. 8.

Figure 9:
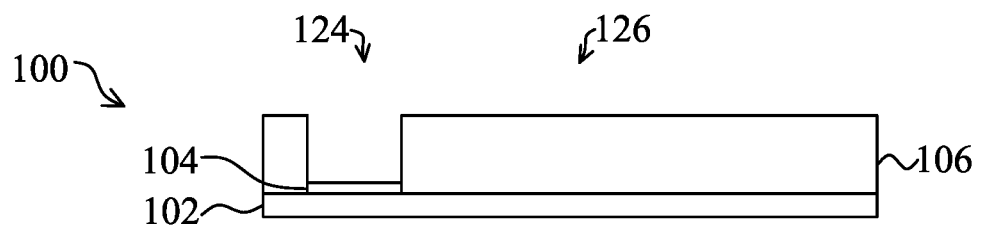

Exposed portions of the insulating material layer 106 are etched away using an etch process, and the masking material 122 is removed, as shown in FIG. 9. The contact pads 104 are exposed through the insulating material layer 106 in the signal bump region 124. The insertion bump region 126 of the substrate 102 remains covered by the insulating material layer 106.

If the insulating material layer 106 comprises a photosensitive material, the masking material 122 is not included in the process flow, and the insulating material layer 106 is directly patterned, in some embodiments.

Figure 10:
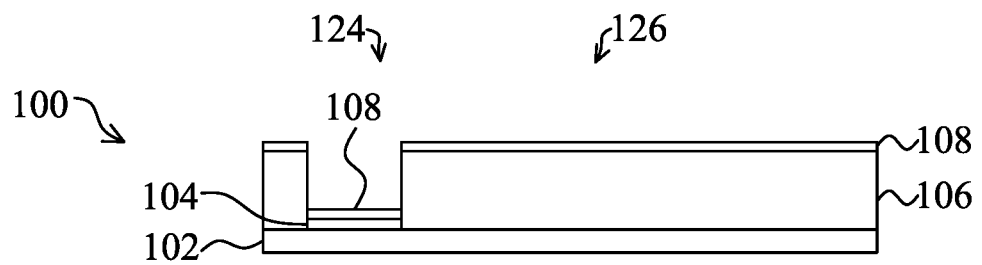

Next, a seed layer 108 is formed on or deposited over the insulating material layer 106 and over the contact pads 108 in the signal bump region 124 of the substrate 102, as shown in FIG. 10. The seed layer 108 comprises Cu, a Cu alloy, Ti, or combinations or multiple layers thereof, as examples. In some embodiments, the seed layer 108 comprises a first layer of Ti and a second layer of Cu disposed over the first layer of Ti, as another example. Alternatively, the seed layer 108 may comprise other materials. The seed layer 108 comprises a thickness of about 100 Angstroms to about 10,000 Angstroms, or between about 100 Angstroms to about 1,000 Angstroms in some embodiments. The seed layer 108 is sputtered on in some embodiments. The seed layer 108 may be formed using other methods and may comprise other dimensions. The seed layer 108 comprises an under-ball metallization (UBM) layer in some embodiments, for example.

Figure 11:
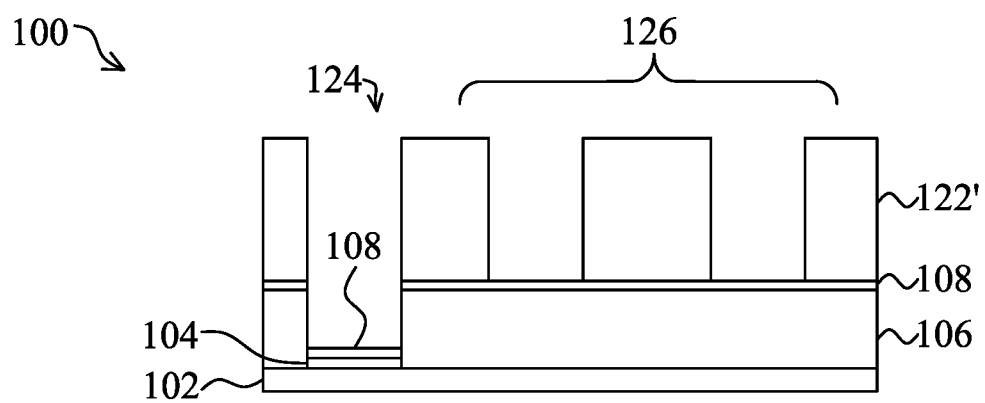

A masking material 122' comprising a similar material described for masking material 122 is formed over the seed layer 108, as shown in FIG. 11. The masking material 122' is patterned using photolithography as described for masking material 122, to remove portions of the masking material 122' from the signal bump region 124 and the insertion bump region 126. The masking material 122' is patterned with a desired shape for signal bumps 114 and insertion bumps 116 in accordance with some embodiments, for example.

Figure 12:
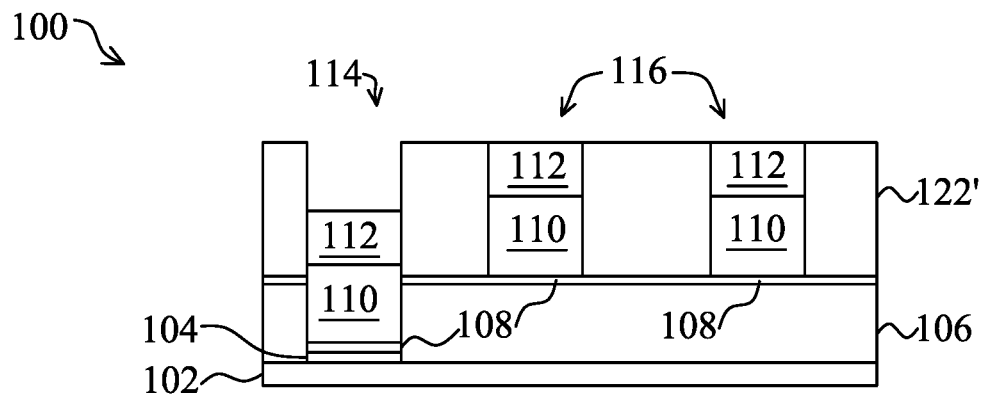

A plating process is used to from the signal bumps 114 and insertion bumps 116 within the masking material 122', as shown in FIG. 12. A first plating process is used to form conductive material 110 within the patterned masking material 122' and insulating material layer 106 over the seed layer 108. The conductive material 110 comprises Cu or a Cu alloy in some embodiments, although alternatively, other materials may be used. A second plating process is used to form a cap layer 112 over the conductive material 110 within the masking material 122' in some embodiments. The cap layer 112 is not included, in other embodiments. The cap layer 112 comprises a eutectic material such as solder, although alternatively, other materials may be used. The signal bumps 114 and the insertion bumps 116 are simultaneously formed using the plating process or plating processes in some embodiments, for example. Forming the insertion bumps 116 and the signal bumps 114 comprises plating a conductive material 110 or 110/112 on the seed layer 108 between the masking material 112' patterns in some embodiments, for example.

Figure 13:
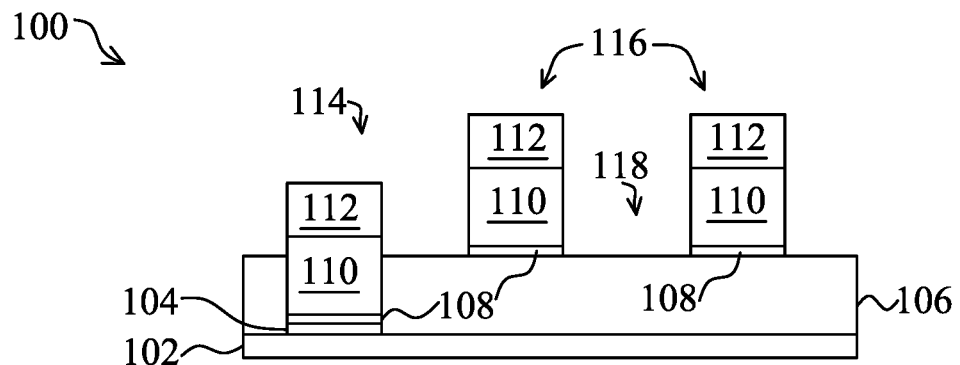

The masking material 122' is then removed, as shown in FIG. 13. Portions of the seed layer 108, e.g., exposed portions of the seed layer 108, are also removed. The signal bumps 114 and the insertion bumps 116 comprise the seed layer 108, the conductive material 110, and also the cap layer 112, if the cap layer 112 is included. Each signal bump 114 is coupled to and disposed over a contact pad 104 disposed on the surface of the substrate 102. The signal bumps 114 provide electrical connections to the substrate 102. The insertion bumps 116 assist in the alignment of the semiconductor device 100 with another semiconductor device. The insertion bumps 116 may comprise a plurality of insertion bumps 116 arranged around a central region that an insertion bump on another semiconductor device can plug into. Alternatively, the insertion bump 116 may comprise a single bump with a hollow region 118 formed therein that an insertion bump on another semiconductor device can plug into.

In other embodiments, one plug-shaped insertion bump 116 is formed in the insertion bump region 126 (not shown in FIGS. 6 through 13; see FIG. 3). The plug-shaped insertion bump 116 is adapted to align the semiconductor device 100 with a receptacle-shaped insertion bump on another semiconductor device. A single plug-shaped insertion bump 116 may be formed using the methods described for FIGS. 6 through 13, for example.

Figure 14:
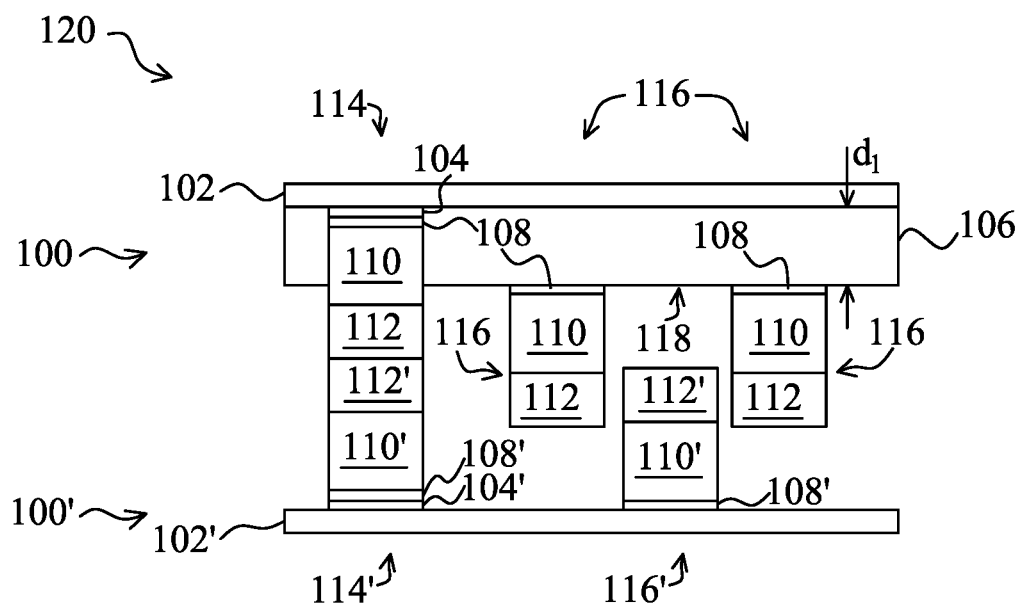
FIGS. 14 and 15 are cross-sectional views of semiconductor device packages that include a semiconductor device manufactured in accordance with the methods illustrated in FIGS. 6 through 13.
Figure 15:
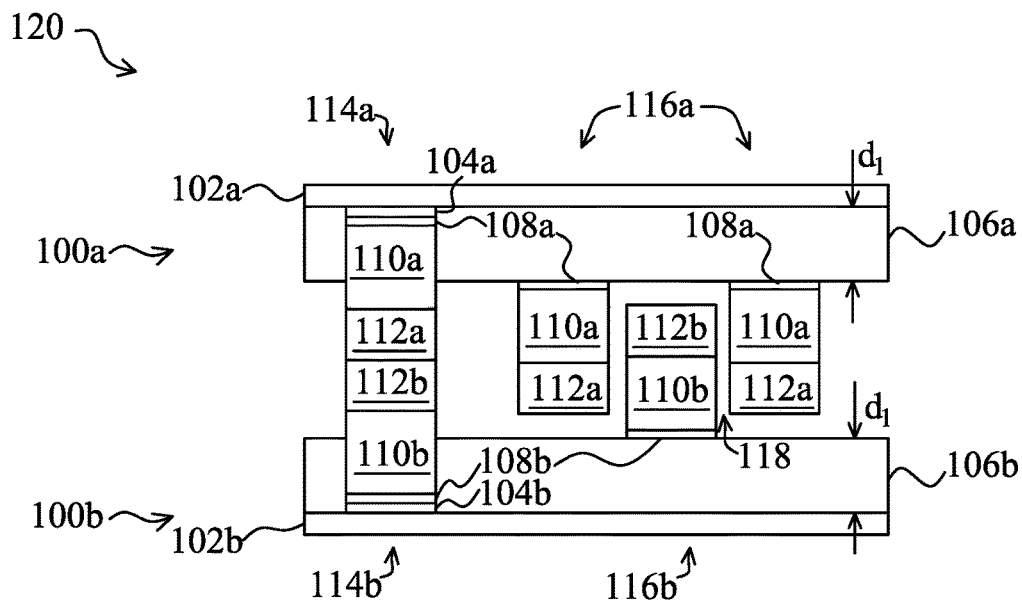

FIGS. 14 and 15 are cross-sectional views of semiconductor device packages 120 that include a semiconductor device 100 manufactured in accordance with the methods illustrated in FIGS. 6 through 13. The semiconductor device 100 shown in FIG. 13 is inverted or "flipped", and the semiconductor device 100 is coupled to another semiconductor device 100', as shown in FIG. 14. The semiconductor devices 100 and 100' are flip-chip bonded in some embodiments, for example. Semiconductor device 100' includes a signal bump 114' that is coupled to a signal bump 114 of semiconductor device 100. A plug-shaped insertion bump 116' is formed directly over the substrate 102' of the semiconductor device 100', rather than over an insulating material layer 106 disposed over the substrate 102 as shown for semiconductor device 100. The plug-shaped insertion bump 116' inserts into the central hollow region 118 of insertion bump or bumps 116, aligning the semiconductor devices 100 and 100' together.

One semiconductor device 100 including the novel insertion bumps 116 formed over an insulating material layer 106 may be coupled to another semiconductor device 100 including insertion bumps 116 formed over an insulating material layer 106 described herein. FIG. 15 illustrates a first semiconductor device 100a coupled to a second semiconductor device 100b in a flip-chip bonding method. The insulating material layers 106a and 106b provide improved alignment for the semiconductor device package 120 by raising top surfaces of the insertion bumps 116a and 116b above top surfaces of the signal bumps 114a and 114b, respectively, providing an increased amount of overlap of the insertion bumps 116a and 116b.

Figure 16:
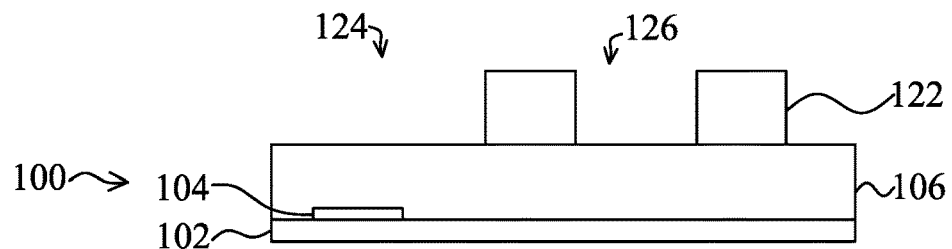
FIGS. 16 through 21 are cross-sectional views illustrating methods of manufacturing a semiconductor device in accordance with some embodiments.
Figure 17:
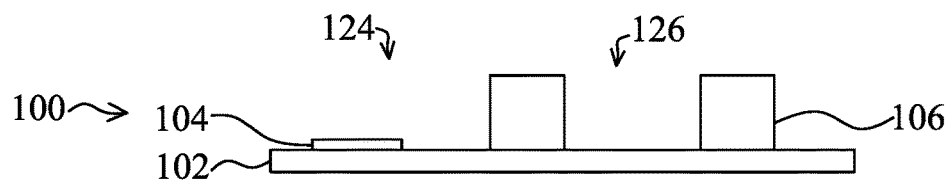

FIGS. 16 through 21 are cross-sectional views illustrating methods of manufacturing a semiconductor device 100 in accordance with some embodiments. Portions of the insulating material layer 106 are removed from over the substrate 102 in the signal bump region 124 and the insertion bump region 126 in these embodiments. The insulating material layer 106 is left remaining only in areas where an insertion bump or insertion bumps 116 will be formed, for example. After the manufacturing steps shown in FIGS. 6 and 7, a masking material 122 is formed over the insulating material layer 106, as shown in FIG. 16. The masking material 122 is patterned using photolithography, also shown in FIG. 16, and the masking material 122 is used as an etch mask while portions of the insulating material 106 are etched away or removed, as shown in FIG. 17. The insulating material layer 106 is completely removed from the signal bump region 124. The insulating material layer 106 is left remaining in portions of the insertion bump region 126 where an insertion bump 116 or a plurality of insertion bumps 116 will be formed, for example. The insulating material layer 106 is removed from regions of the substrate 102 proximate the insertion bump 116 or insertion bumps 116, before forming the insertion bump 116 or insertion bumps 116, for example, in these embodiments. The masking material 122 is then removed, also shown in FIG. 17. The masking material 122 may not be required if the insulating material layer 106 comprises a photosensitive material, in other embodiments.

Figure 18:
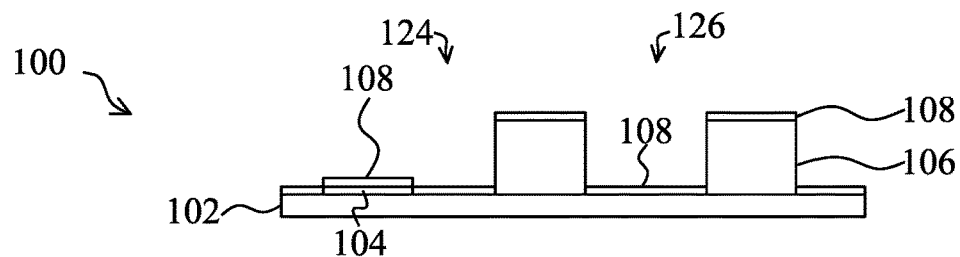
Figure 19:
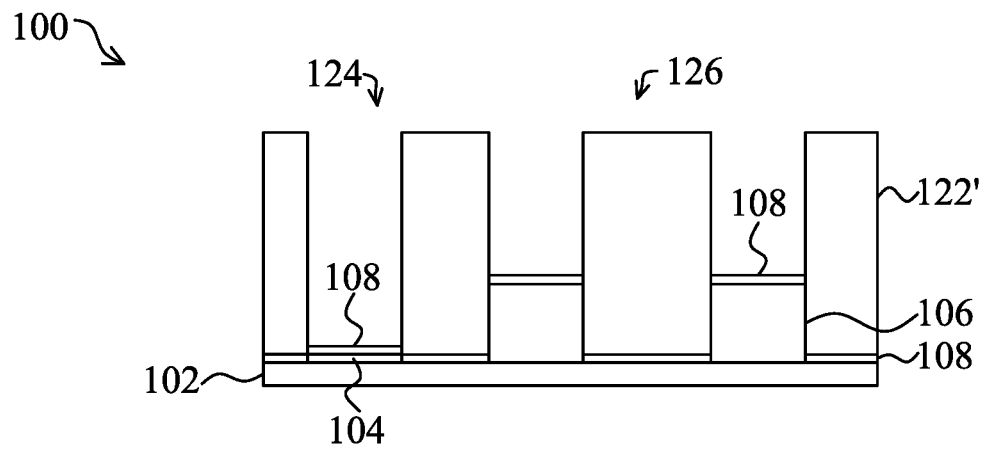

A seed layer 108 is formed over the insulating material layer 106, over the contact pads 108 in the signal bump region 124, and over exposed portions of the substrate 102 in the signal bump region 124 and the insertion bump region 126, as shown in FIG. 18. A masking material 122' is formed over the seed layer 108, as shown in FIG. 19, and the masking material 122' is patterned using photolithography, removing portions of the masking material 122' from over the seed layer 108 in the signal bump region 124 and the insertion bump region 126. The masking material 122' is removed from over the seed layer 108 over the insulating material layer 106 in the insertion bump region 126. The masking material 122' is patterned with a desired shape for signal bumps 114 and insertion bumps 116 in accordance with some embodiments, for example.

Figure 20:
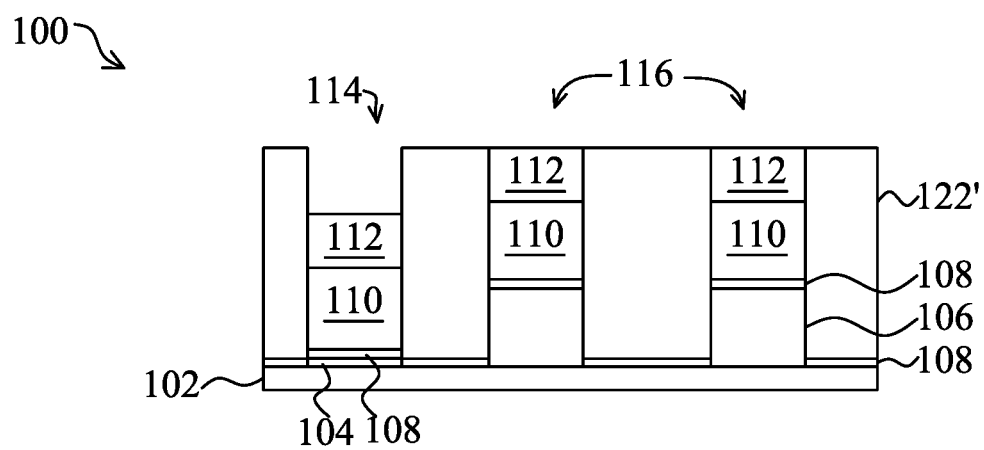
Figure 21:
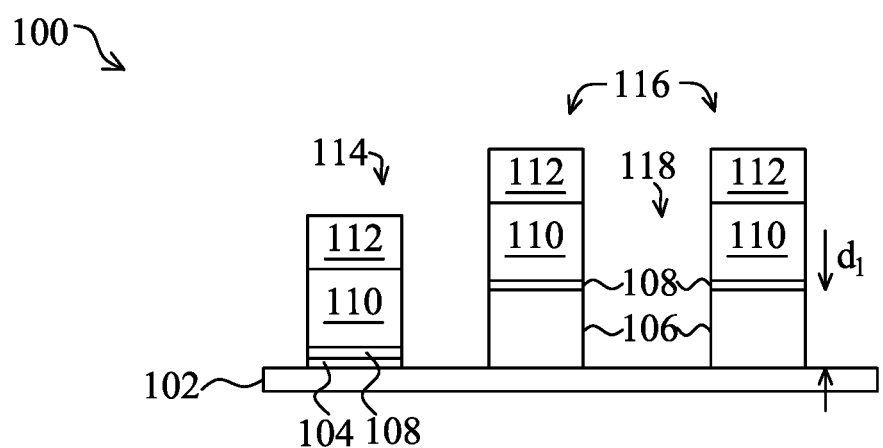

A plating process is used to from the signal bumps 114 and insertion bumps 116 within the patterned masking material 122', as shown in FIG. 20. The cap layer 112 may or may not be included over the conductive material 110 of the signal bumps 114 and insertion bumps 116. The masking material 122' and exposed portions of the seed layer 108 are then removed, as shown in FIG. 21.

As described for the embodiments shown in FIGS. 6 through 13, the insertion bumps 116 of the semiconductor device 100 may comprise a plurality of insertion bumps 116 arranged around a central region that an insertion bump on another semiconductor device can plug into. Alternatively, the insertion bump 116 may comprise a single bump with a hollow region 118 formed therein that an insertion bump on another semiconductor device can plug into. Or, a single insertion bump 116 may be formed on the semiconductor device 100 that comprises a plug shape. The plug-shaped insertion bump 116 is adapted to align the semiconductor device 100 with a receptacle-shaped insertion bump on another semiconductor device. A single plug-shaped insertion bump 116 may also be formed on the semiconductor device 100 using the methods described for FIGS. 16 through 21, for example, as shown in FIG. 22.

Figure 22:
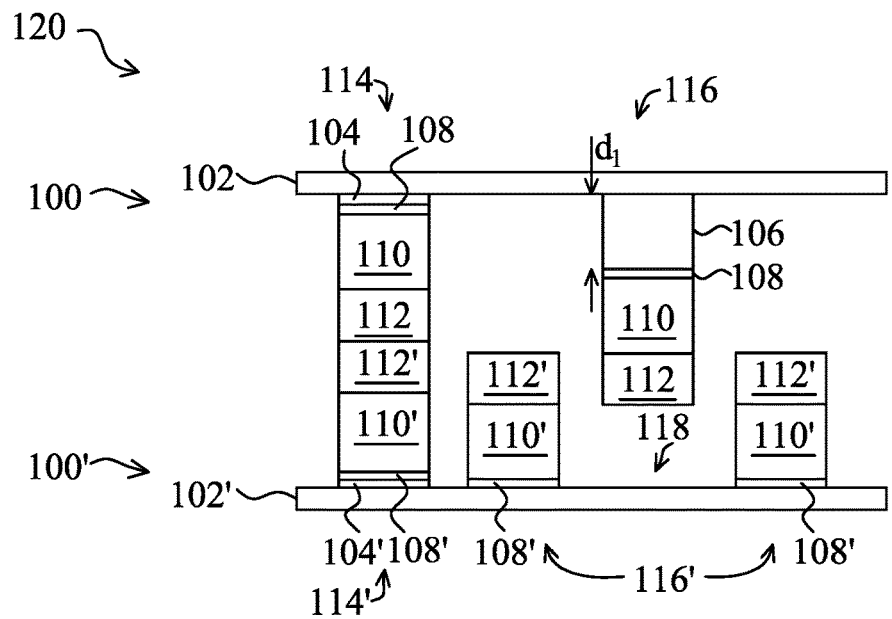
FIGS. 22 and 23 are cross-sectional views of semiconductor device packages that include a semiconductor device manufactured in accordance with the methods illustrated in FIGS. 16 through 21.
Figure 23:
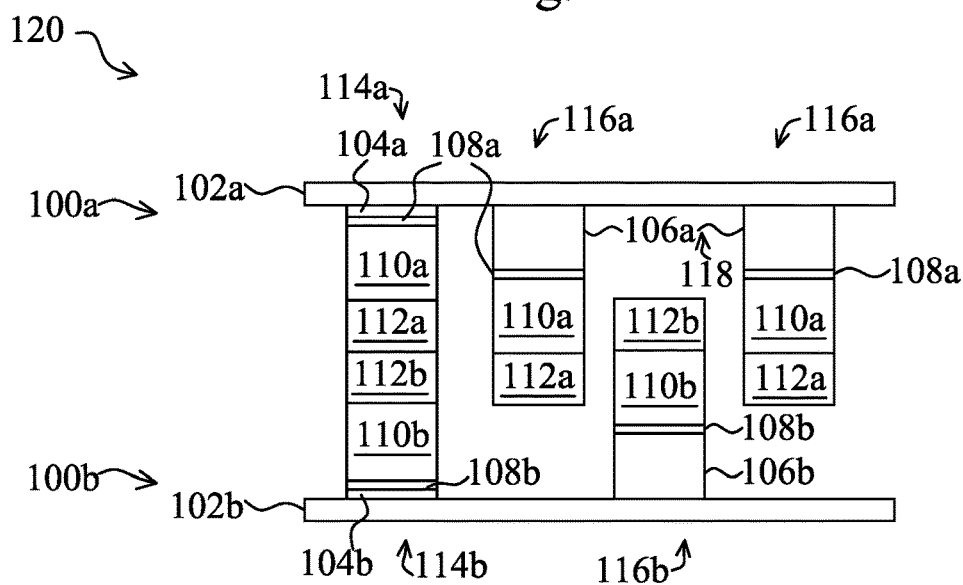

FIGS. 22 and 23 are cross-sectional views of semiconductor device packages 120 that include a semiconductor device 100 manufactured in accordance with the methods illustrated in FIGS. 16 through 21. The semiconductor device 100 may be coupled to a semiconductor device 100' that does not include insertion bumps formed over an insulating material layer as shown in FIG. 22. Alternatively, a semiconductor device 100a including an insertion bump 116a or insertion bumps 116a formed over insulating material layer 106a may be coupled to a semiconductor device 100b that includes an insertion bump 116b or insertion bumps 116b formed over an insulating material layer 106b, as shown in FIG. 23.

FIGS. 24 through 29 are cross-sectional views illustrating methods of manufacturing a semiconductor device 100 in accordance with other embodiments. The insulating material layer 106 is removed from portions of the signal bump region 124 and portions of the insertion bump region 126 in these embodiments, as described for the embodiments shown in FIGS. 16 through 21. However, a portion of the insulating material layer 106 is also left remaining in the signal bump region 124. The portions of the insulating material layer 106 surround a lower portion of the conductive material 110 of the signal bumps 114 and advantageously provide increased structural support for the signal bumps 114 in these embodiments. Each of the plurality of signal bumps 114 comprises first portions that are not disposed over the insulating material layer 106 and second portions that are disposed over the insulating material layer 106, for example.

Figure 24:
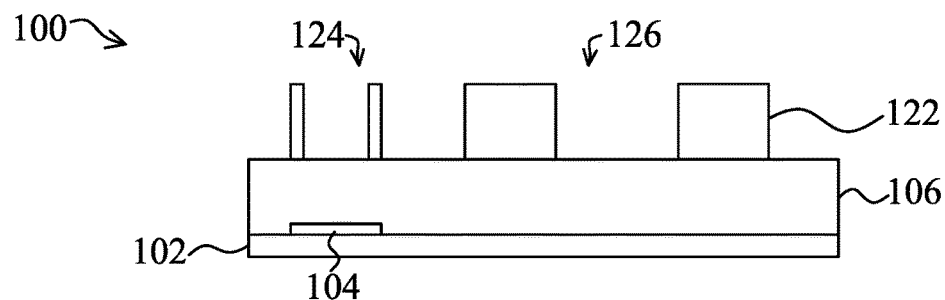
FIGS. 24 through 29 are cross-sectional views illustrating methods of manufacturing a semiconductor device in accordance with some embodiments.
Figure 25:
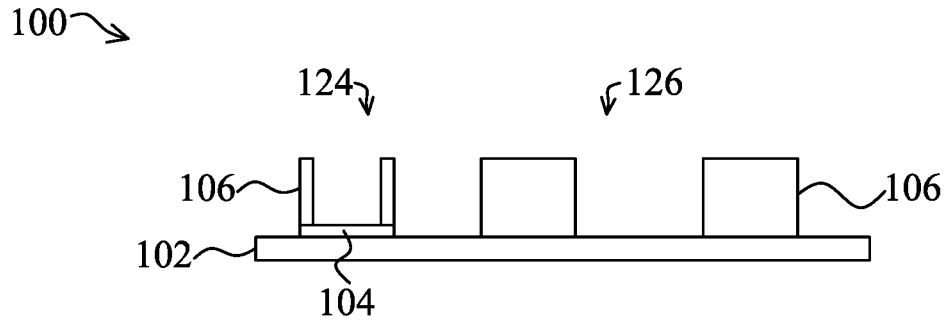

After the manufacturing steps shown in FIGS. 6 and 7, a masking material 122 is formed over the insulating material layer 106, as shown in FIG. 24. The masking material 122 may not be required if the insulating material layer 106 comprises a photosensitive material, as in the other embodiments. The masking material 122 is patterned using photolithography, also shown in FIG. 24, and the masking material 122 is used as an etch mask while portions of the insulating material 106 are etched away or removed, as shown in FIG. 25. The insulating material layer 106 is removed from a first portion of the signal bump region 124 disposed over the contact pad 104. The insulating material layer 106 is removed from a first portion of the signal bump region 124 disposed over a central region of the contact pad 104 in some embodiments, for example. Alternatively, the insulating material layer 106 may be removed from a first portion of the signal bump region 124 disposed over an edge region or a region offset from a central region of the contact pad 104 in other embodiments, as another example. The insulating material layer 106 is left remaining in a second portion of the signal bump region 124. The insulating material layer 106 is left remaining in a second portion of the signal bump region 124 disposed over an edge region or edge regions of the contact pad 104 in some embodiments, for example, as illustrated in FIG. 25. The insulating material layer 106 is left remaining around the contact pad 104 in some embodiments, for example. The insulating material layer 106 is also left remaining in areas of the insertion bump region 126 where an insertion bump 116 or a plurality of insertion bumps 116 will be formed. The insulating material layer 106 is removed from regions of the substrate 102 proximate to the insertion bump 116 or insertion bumps 116, before forming the insertion bump 116 or insertion bumps 116, for example, in these embodiments. Regions of the substrate 102 are left exposed proximate to the insertion bumps 116 after the removal of portions of the insulating material layer 106, for example. The masking material 122 is then removed, also shown in FIG. 25.

Figure 26:
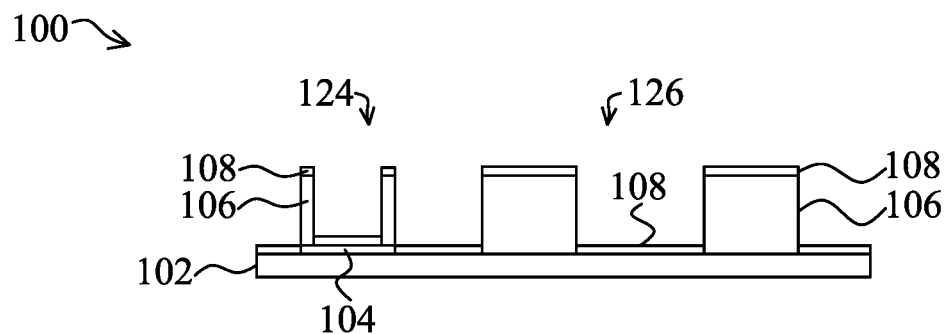
Figure 27:
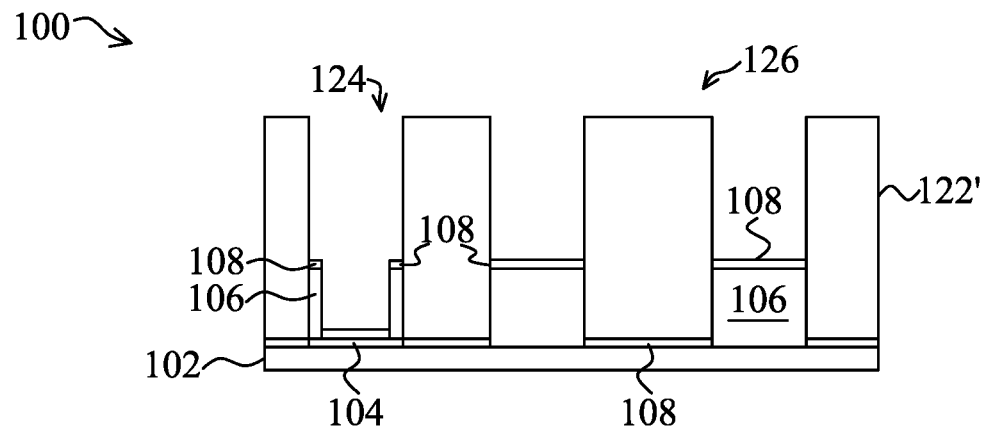

A seed layer 108 is formed over the insulating material layer 106, over an exposed portion of the signal bump region 124 (e.g., over the contact pads 108 in the signal bump region 124), and over exposed portions of the substrate 102 in the signal bump region 124 and the insertion bump region 126, as shown in FIG. 26. A masking material 122' is formed over the seed layer 108, as shown in FIG. 27, and the masking material 122' is patterned using photolithography, removing portions of the masking material 122' from over the seed layer 108 in the signal bump region 124 and the insertion bump region 126. The masking material 122' is removed from over the seed layer 108 over the insulating material layer 106 over the first portion of the signal bump region 124. The masking material 122' is also removed from over the seed layer 108 over the insulating material layer 106 in the insertion bump region 126. The masking material 122' is patterned with a desired shape for signal bumps 114 and insertion bumps 116 in accordance with some embodiments, for example.

Figure 28:
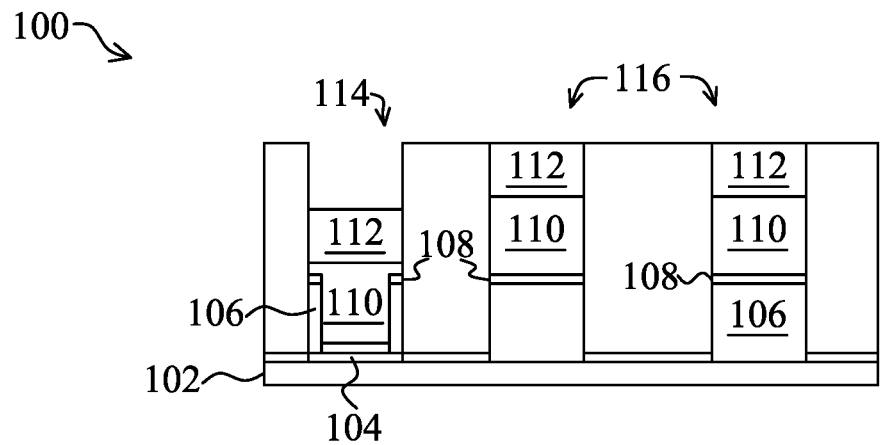
Figure 29:
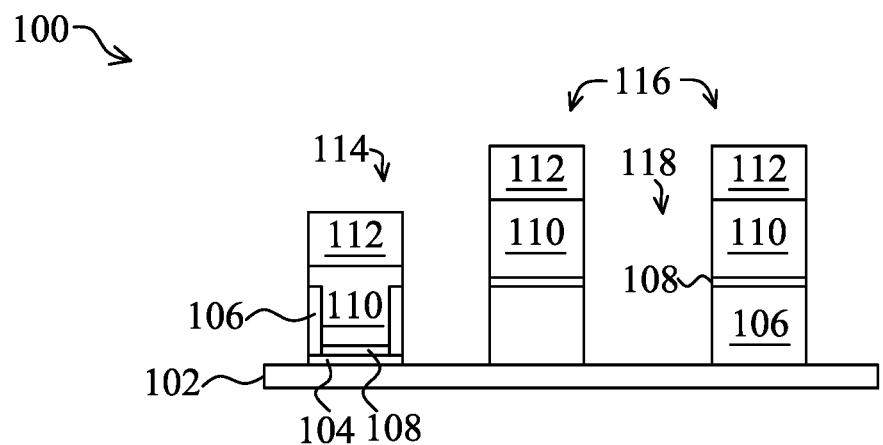

A plating process is then used to form the signal bumps 114 and insertion bumps 116 within the masking material 122', as shown in FIG. 28. The cap layer 112 may or may not included over the conductive material 110 of the signal bumps 114 and insertion bumps 116. The masking material 122' and exposed portions of the seed layer 108 are then removed, as shown in FIG. 29. The signal bumps 114 include a first portion (e.g., a lower portion in FIG. 29) circumferentially enclosed by the insulating material layer 106 and a second portion (e.g., an upper portion in FIG. 29) disposed over the first portion and the circumferential insulating material layer 106.

As described for the embodiments shown in FIGS. 6 through 13 and FIGS. 16 through 21, the insertion bumps 116 of the semiconductor device 100 may comprise a plurality of insertion bumps 116 arranged around a central region that an insertion bump on another semiconductor device can plug into. Alternatively, the insertion bump 116 may comprise a single bump with a hollow region 118 formed therein that an insertion bump on another semiconductor device can plug into. Or, a single insertion bump 116 may be formed on the semiconductor device 100 that comprises a plug shape. The plug-shaped insertion bump 116 is adapted to align the semiconductor device 100 to a receptacle-shaped insertion bump on another semiconductor device. A single plug-shaped insertion bump 116 may also be formed on the semiconductor device 100 using the method described for FIGS. 24 through 29, for example, as shown in FIG. 30.

Figure 30:
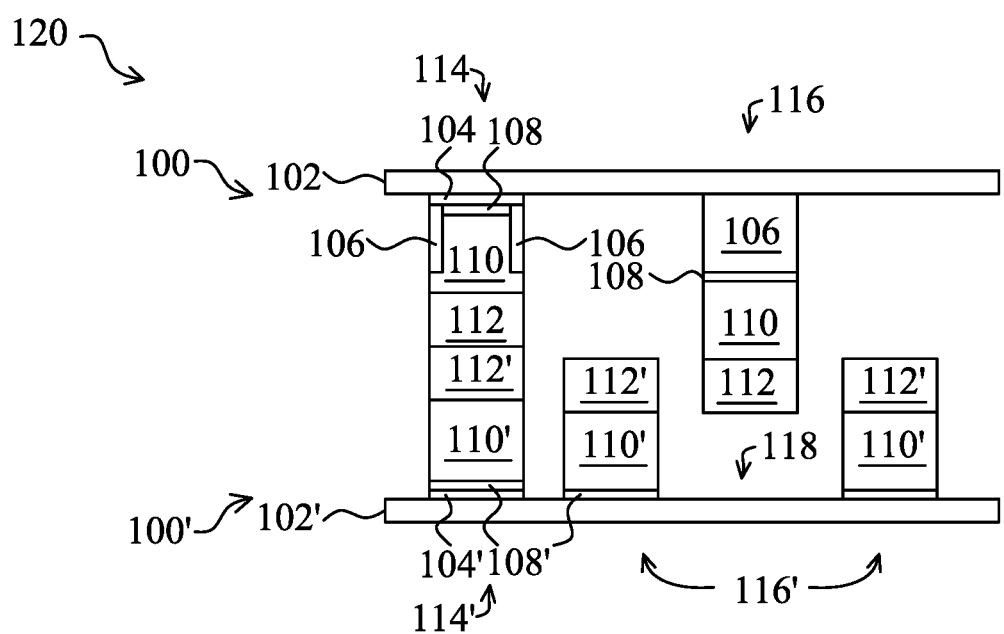
FIGS. 30 and 31 are cross-sectional views of semiconductor device packages that include a semiconductor device manufactured in accordance with the methods illustrated in FIGS. 24 through 29.
Figure 31:
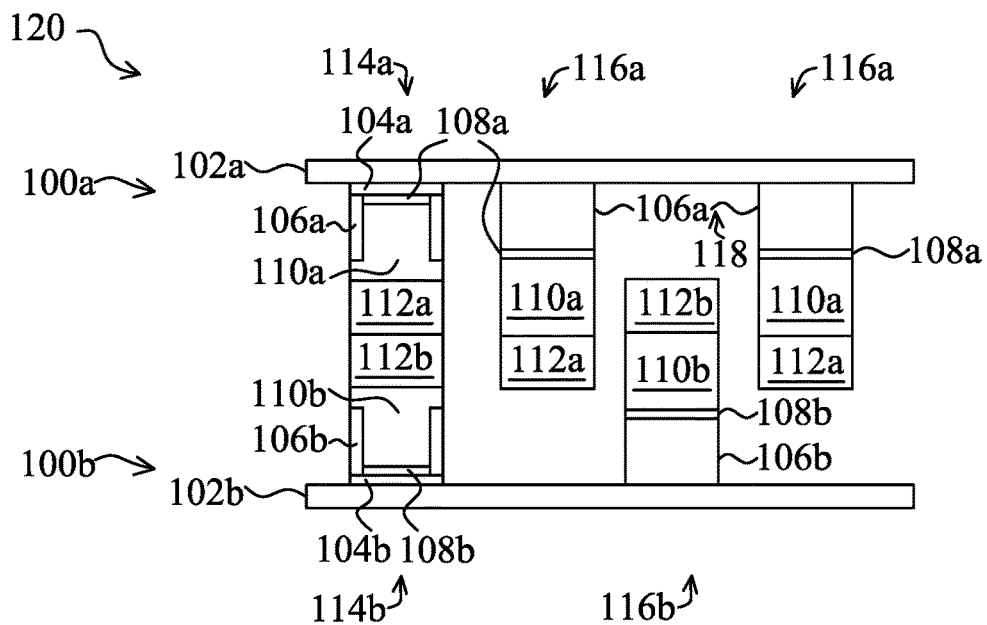

FIGS. 30 and 31 are cross-sectional views of semiconductor device packages 120 that include a semiconductor device 100 manufactured in accordance with the methods illustrated in FIGS. 24 through 29. The semiconductor device 100 may be coupled to a semiconductor device 100' that does not include insertion bumps formed over an insulating material layer, as shown in FIG. 30. Alternatively, a semiconductor device 100a including an insertion bump 116a or insertion bumps 116a formed over an insulating material layer 106a may be coupled to a semiconductor device 100b that includes an insertion bump 116b or insertion bumps 116b formed over an insulating material layer 106b, as shown in FIG. 31.

Figure 32:
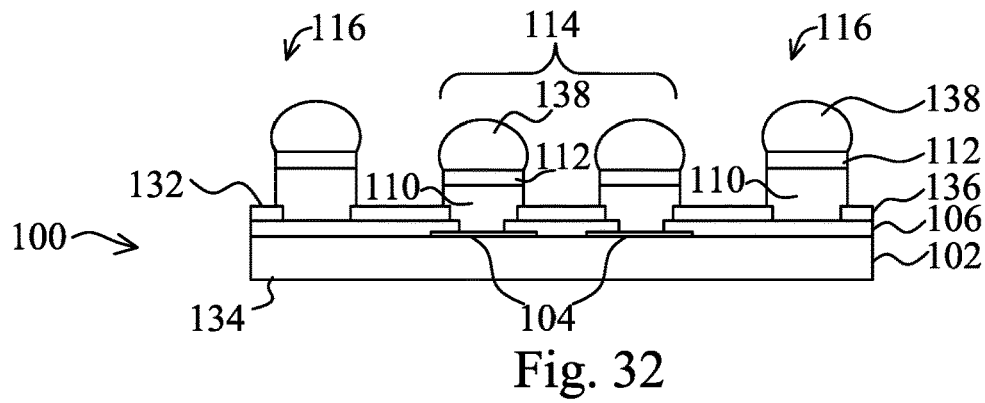
FIGS. 32 and 33 illustrate cross-sectional views of semiconductor devices in accordance with other embodiments.
Figure 33:
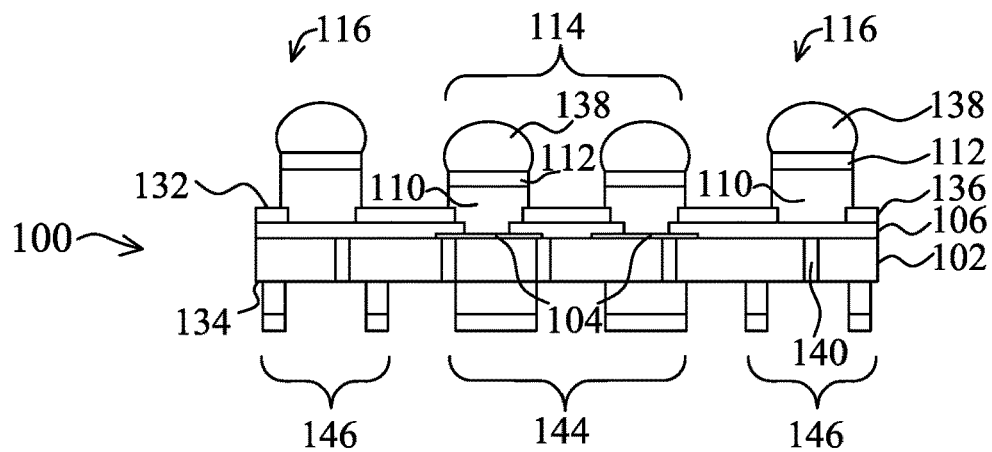

FIGS. 32 and 33 illustrate cross-sectional views of semiconductor devices 100 in accordance with other embodiments. The semiconductor devices 100 include a first side 132 and a second side 134 opposite the first side 132. In FIG. 32, an insulating material layer 136 comprising similar materials described for insulating material layer 106 is disposed over insulating material layer 106 on the first side 132 of the semiconductor device 100, between the signal bumps 114 and insertion bumps 116. The insulating material layer 136 is not included in some embodiments. A plurality of solder balls 138 is coupled to the cap layer 112 of the signal bumps 114 and the insertion bumps 116, in some embodiments. The insertion bumps 116 are disposed on edge regions of the substrate 102, disposed around the signal bumps 114 in a central region of the substrate 102, in some embodiments.

In FIG. 33, the semiconductor device 100 includes insulating material layer 136 formed on the first side 132 and the solder balls 138 formed on the signal bumps 114 and the insertion bumps 116. The substrate 102 includes a plurality of through substrate vias (TSVs) 140 formed therein. The TSVs 140 comprise a conductive or semiconductive material and provide vertical electrical connections for the semiconductor device 100. The semiconductor device 100 includes a plurality of signal bumps 144 and a plurality of insertion bumps 146 formed on the second side 134 thereof. The signal bumps 144 and the insertion bumps 146 may be formed directly on the substrate 102 as described previously for semiconductor devices 100' herein, or alternatively, the signal bumps 144 may be formed directly on the substrate 102 and the insertion bumps 146 may be formed on an insulating material layer (e.g., such as insulating material layer 106, not shown) disposed over the substrate 102, as described for semiconductor devices 100 herein.

The semiconductor device 100 shown in FIG. 33 can advantageously be coupled to another semiconductor device 100 or 100' on the first side 132 using signal bumps 114 for electrical and mechanical connections and insertion bumps 116 for alignment and mechanical registration. The semiconductor device 100 can also be coupled to another semiconductor device 100 or 100' in the second side 134 using signal bumps 144 for electrical and mechanical connections and insertion bumps 146 for alignment and mechanical registration.

In some embodiments, insertion bumps 116 on the first side 132 comprise plug-shapes, and insertion bumps 146 on the second side 134 comprise receptacle-shapes, so that a plurality of the semiconductor devices 100 can be vertically stacked onto one another. Alternatively, insertion bumps 116 on the first side 132 comprise receptacle-shapes, and insertion bumps 146 on the second side 134 comprise plug-shapes, so that a plurality of the semiconductor devices 100 can be vertically stacked onto one another. In other embodiments, the semiconductor device 100 can comprise plug-shaped insertion bumps 116 and 146 on both the first side 132 and the second side 134, respectively, or the semiconductor device 100 can comprise receptacle-shaped insertion bumps 116 and 146 on both the first side 132 and the second side 134, respectively, not shown.

Figure 34:
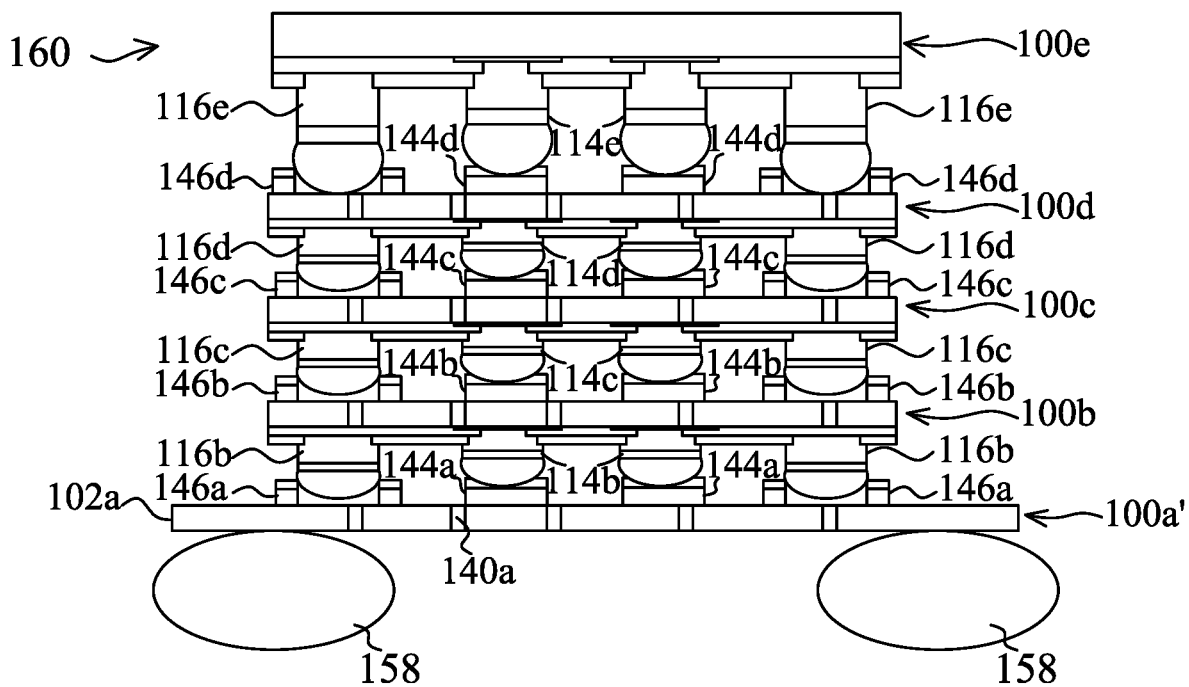
FIG. 34 is a cross-sectional view of a semiconductor device package that includes the semiconductor devices shown in FIGS. 32 and 33.
Figure 35:
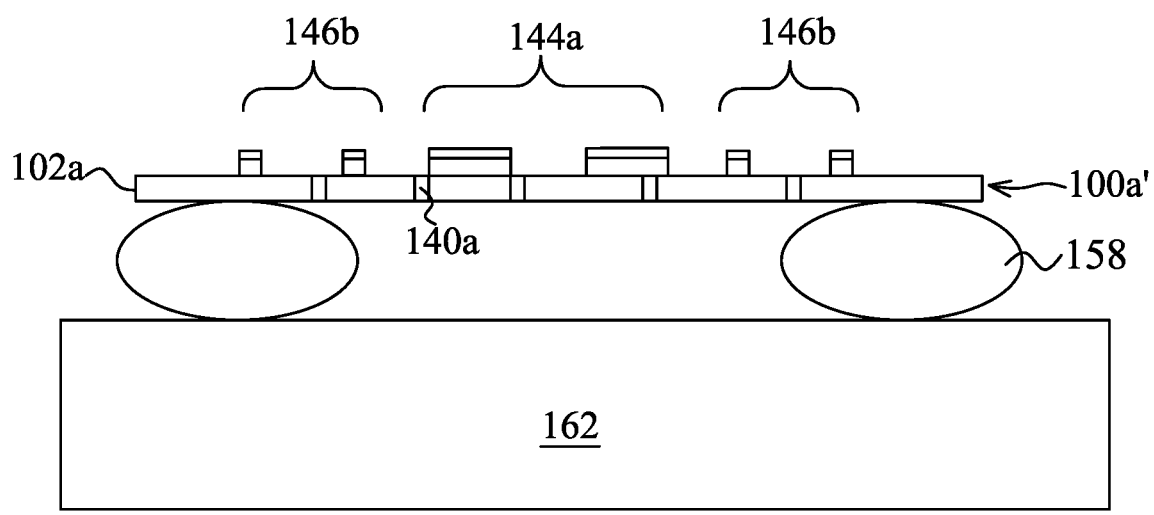
FIGS. 35 through 38 are cross-sectional views illustrating methods of packaging semiconductor devices in accordance with some embodiments.
Figure 36:
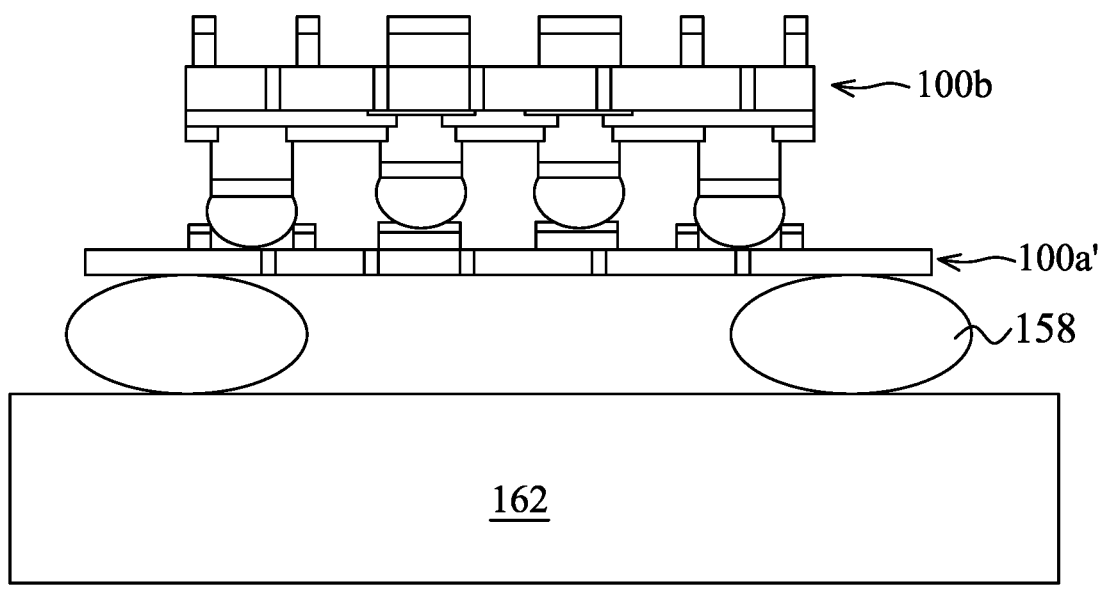
Figure 37:
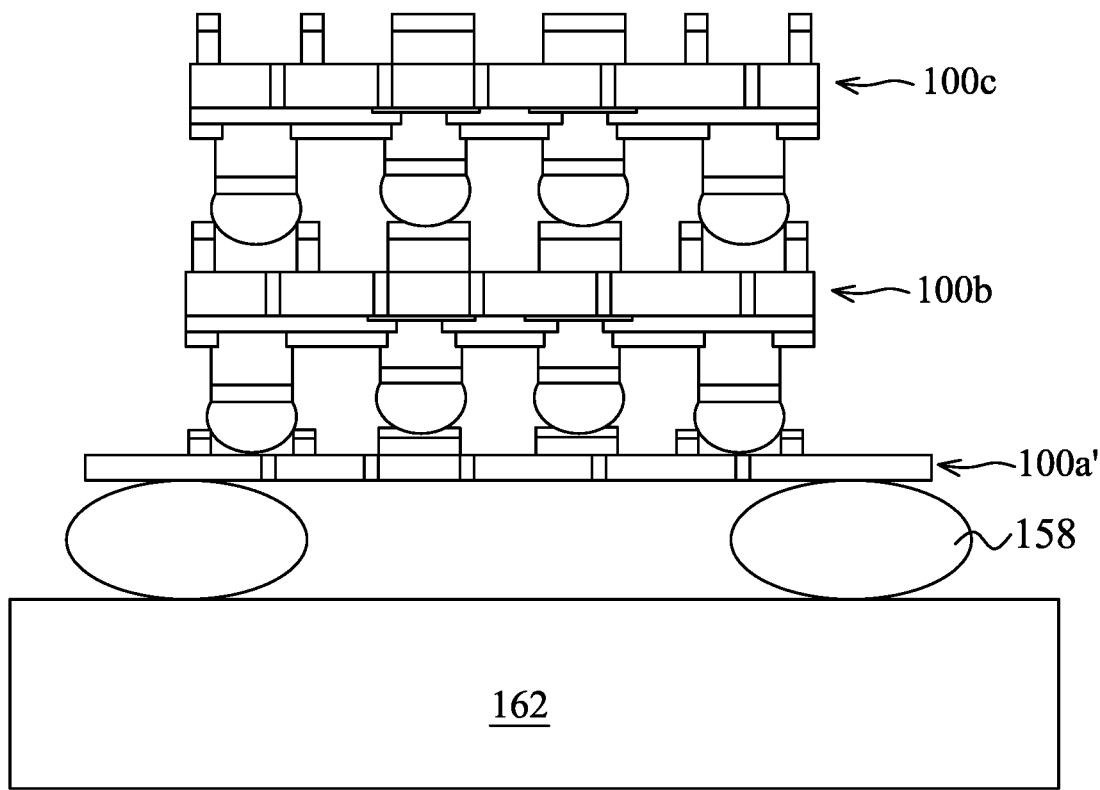

FIG. 34 is a cross-sectional view of a semiconductor device package 160 that includes the semiconductor device 100 shown in FIG. 32 and a plurality of semiconductor devices 100 shown in FIG. 33 stacked in a tiered arrangement. For example, semiconductor devices 100b, 100c, and 100d each comprise a semiconductor device 100 shown in FIG. 33, and semiconductor device 100e comprises a semiconductor device 100 shown in FIG. 34. Every element is not labeled for semiconductor devices 100b, 100c, 100d, and 100e in FIG. 34: see FIGS. 32 and 33.

Semiconductor device 100a' includes signal bumps 144a and insertion bumps 146a as described for FIG. 33 that are formed over a substrate 102a. The substrate 102a includes a plurality of TSVs 140a formed therein. Solder balls 158 are coupled to a bottom side of the substrate 102a, and signal bumps 114b of semiconductor device 100b are coupled to signal bumps 144a of semiconductor device 100a'. Semiconductor device 100b is aligned with semiconductor device 100a' by insertion bumps 116b and insertion bumps 146a of semiconductor device 100b and semiconductor device 100a', respectively.

Semiconductor devices 100c, 100d, and 100e are similarly stacked over semiconductor devices 100b and 100a' in a tiered arrangement. Signal bumps 114c of semiconductor device 100c are coupled to signal bumps 144b of semiconductor device 100b, and semiconductor device 100c is aligned with semiconductor device 100b by insertion bumps 116c and insertion bumps 146b of semiconductor device 100c and semiconductor device 100b, respectively. Signal bumps 114d of semiconductor device 100d are coupled to signal bumps 144c of semiconductor device 100c, and semiconductor device 100d is aligned with semiconductor device 100c by insertion bumps 116d and insertion bumps 146c of semiconductor device 100d and semiconductor device 100c, respectively. Signal bumps 114e of semiconductor device 100e are coupled to signal bumps 144d of semiconductor device 100d, and semiconductor device 100e is aligned with semiconductor device 100d by insertion bumps 116e and insertion bumps 146d of semiconductor device 100e and semiconductor device 100d, respectively.

The substrate 102a of semiconductor device 100a' may comprise an interposer substrate, a packaging substrate, or a packaging device, for example. The substrates 102 of semiconductor devices 100b, 100c, 100d, and 100e may comprise integrated circuit dies that have different functional circuitry such as memory devices, logic circuitry, or other functions. The substrates 102 of semiconductor devices 100b, 100c, 100d, and 100e may alternatively comprise integrated circuit dies that have the same or similar functional circuitry disposed thereon. The semiconductor device package 160 comprises a system-on-a-chip (SOC) device in some embodiments, for example. Alternatively, the substrates 102 of the semiconductor devices 100a', 100b, 100c, 100d, and 100e may comprise other types of substrates, and the semiconductor device package 160 may comprise other types of devices.

Figure 38:
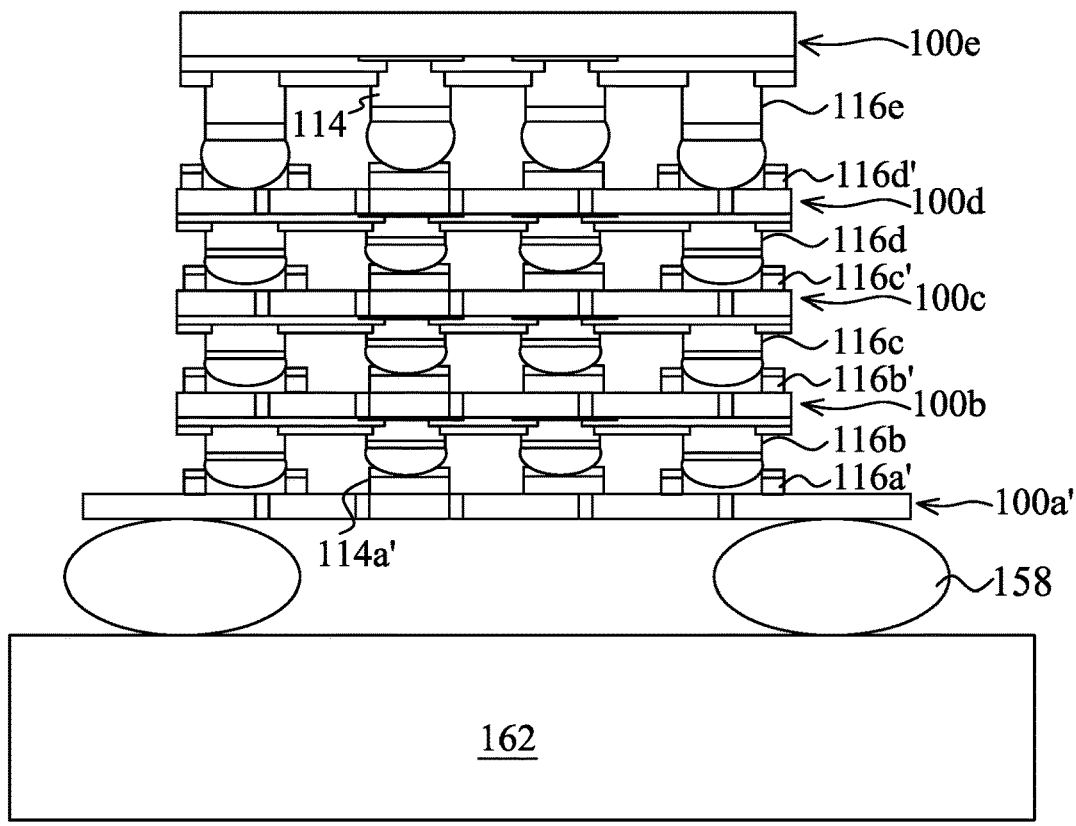

FIGS. 35 through 38 are cross-sectional views illustrating methods of packaging semiconductor devices 100a', 100b, 100c, 100d, and 100e together to form a semiconductor device package 160 in accordance with some embodiments. First, a substrate 162 is provided. The substrate 162 may comprise a printed circuit board (PCB) or other type of substrate. A semiconductor device 100a' described with reference to FIG. 34 is coupled to the substrate 162 using solder balls 158. Semiconductor devices 100b, 100c, 100d, and 100e are sequentially placed on top of semiconductor devices 100a, 100b, 100c, and 100d, respectively. For example, in FIG. 36, semiconductor device 100b is placed on semiconductor device 100a', and in FIG. 37, semiconductor device 100c is placed on semiconductor device 100b. After all of the semiconductor devices 100a', 100b, 100c, 100d and 100e have been sequentially stacked in a tiered arrangement, as shown in FIG. 38, the semiconductor device package 160 is subjected to a solder re-flow process, which reflows the solder or eutectic material on the signal bumps 114 and 144 (see FIGS. 32 and 33), making electrical and mechanical connections for the semiconductor device package 160. The insertion bumps 116 and 146 (see FIGS. 32 and 33) advantageously provide alignment between each of the semiconductor devices 100a', 100b, 100c, 100d and 100e during the stacking process. The insertion bumps 116 and 146 also maintain an aligned position of the semiconductor devices 100a', 100b, 100c, 100d and 100e during the solder re-flow process, preventing die shift, the formation of shorts or opens, and resulting in improved yields.

The top and bottom semiconductor devices 100a' and 100e include insertion bumps 116a' and 116e, respectively, disposed only on one side in some embodiments, as illustrated in FIG. 38. The other semiconductor devices 100b, 100c, and 100d include insertion bumps 116b' and 116b, 116c' and 116c, and 116d' and 116d, respectively, on both sides. In some embodiments, semiconductor devices 100b, 100c, and 100d comprise a plurality of third semiconductor devices disposed between a first semiconductor device 100a' and a second semiconductor device 100e, each of the plurality of third semiconductor devices 100b, 100c, and 100d including one or more third insertion bumps 116b', 116c', and 116d' disposed on a first side and one or more fourth insertion bumps 116b, 116c, and 116d disposed on a second side, the second side being opposite the first side. Adjacent ones of the first semiconductor device 100a', the second semiconductor device 100e, and the plurality of third semiconductor devices 100b, 100c, and 100d are mechanically aligned by the first insertion bumps 116a', the second insertion bumps 116e, the third insertion bumps, and/or the fourth insertion bumps 116b' and 116b, 116c' and 116c, 116d' and 116d.

In other embodiments, the top and bottom semiconductor devices 100a' and 100e that include insertion bumps 116a' and 116e, respectively, disposed only on one side can be coupled together. For example, signal bumps 114' of a first semiconductor device 100a' can be coupled to signal bumps 114 of a second semiconductor device 100e and aligned by the insertion bumps 116a' and 116e (not shown in FIG. 38; see the embodiments shown in FIGS. 1, 3, 14, 15, 22, 23, 30, and 31.)

Figure 39:
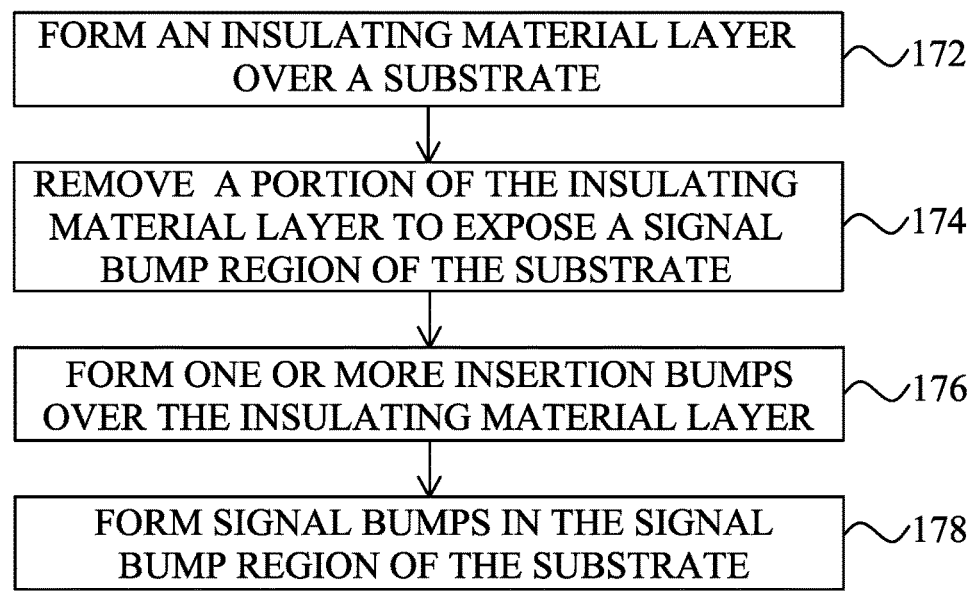
FIG. 39 is a flow chart of a method of manufacturing a semiconductor device in accordance with some embodiments.

FIG. 39 is a flow chart 170 of a method of manufacturing a semiconductor device 100 in accordance with some embodiments. In step 172, an insulating material layer 106 is formed over a substrate 102. In step 174, a portion of the insulating material layer 106 is removed from at least a portion of a signal bump region 124 of the substrate 102 to expose the signal bump region 124 of the substrate 102. For example, in FIGS. 8 and 9, the insulating material layer 106 is removed completely from the signal bump region 124. As another example, in FIGS. 16 and 17, the insulating material layer 106 is also removed completely from the signal bump region 124. As yet another example, in FIGS. 24 and 25, the insulating material layer 106 is removed from a portion of the signal bump region 124, yet the insulating material layer 106 is left remaining in another portion of the signal bump region 124. In step 176, one or more insertion bumps 116 is formed over the insulating material layer 106. In step 178, signal bumps 114 are formed in the signal bump region of the substrate 100.

Some embodiments of the present disclosure include methods of manufacturing semiconductor devices, and also include semiconductor devices that have been manufactured using the methods described herein. Some embodiments of the present disclosure also include semiconductor device packages that include the novel semiconductor devices described herein.

Advantages of some embodiments of the disclosure include providing semiconductor devices 100 that have insertion bumps 116 formed over an insulating material layer 106 as shown in FIGS. 1 and 3, which raises the insertion bumps 116 away from the substrate 102 so that the top surfaces of the insertion bumps 116 are higher than the top surfaces of the signal bumps 114, providing improved mechanical alignment and insertion during a packaging process. Forming the insertion bumps 116 on the insulating material layer 106 creates an overlap of insertion bumps 116 with insertion bumps 116, 116', or 146 when two semiconductor devices 100 and/or 100' are coupled together, reducing a risk of die shift.

The insertion bumps 116, 116', and 146 provide improved alignment when attaching one semiconductor device to another semiconductor device, insuring correct alignment of the signal bumps 114, 114' and 144. The insertion bumps 116, 116', and 146 also maintain correct alignment of the semiconductor devices 100 before, during, and after solder re-flow processes that are used to electrically and mechanically connect signal bumps 114 and 144 of adjacent semiconductor devices. The novel insertion bumps 116, 116', and 146 also improve alignment accuracy.

Some embodiments of the present disclosure utilize insertion bonding to avoid warpage and/or die shift from die attachment and package transfer, for example. Friction force from the overlapped insertion bumps 116, 116', and 146 can avoid large warpage, particularly in edges or corners of the semiconductor devices 100 in some embodiments, as another example.

The semiconductor devices 100 and 100' with insertion bumps 116, 116', and 146 provide reliable and low cost die stack structures and fabrication methods. The semiconductor devices 100 and 100' can be vertically stacked without using flux or thermal compression bonding (TCB), resulting in reduced thermal budgets. Because flux is not used, a cleaning process to remove flux from the semiconductor device packages 120 and 160 is advantageously not required. The insertion bumps 116, 116', and 146 prevent die shift after die attachment, and thus improve yields and reliability. The fabrication process time is decreased, resulting in increased wafer per hour (WPH).

In some embodiments, portions of the signal bumps 114 are also formed over portions of the insulating material layer 106, which advantageously provides increased structural support for the signal bumps 114. In some embodiments, the solder re-flow process used to connect the signal bumps 114, 114', and 144 of adjacent packages also results in a mechanical connection of insertion bumps 116, 116', and 146 of adjacent packages, because solder also reflows on the insertion bumps 116, 116', and 146 during the re-flow process, which results in improved overall structural strength for the semiconductor device packages 120 and 160. The insertion bumps 116, 116', and/or 146 include tapered sidewalls in some embodiments, which enlarges a self-alignment tolerance.

The novel insertion bumps structures and designs are easily implementable in manufacturing and packaging process flows, and require only one additional material layer (e.g., insulating material layer 106) and photolithography process in some embodiments. In other embodiments, an insulating material layer and lithography process used on another portions of the semiconductor device can be used to form insulating material layer 106 disposed beneath the insertion bumps, for example.

In accordance with some embodiments of the present disclosure, a semiconductor device includes a substrate, an insulating material layer having openings on a surface of the substrate, and one or more insertion bumps disposed over the insulating material layer. The semiconductor device includes a plurality of signal bumps having portions not disposed over the insulating material layer.

In accordance with other embodiments, a method of manufacturing a semiconductor device includes forming an insulating material layer over a substrate, and removing a portion of the insulating material layer to expose a signal bump region of the substrate. The method includes forming one or more insertion bumps over the insulating material layer, and forming a plurality of signal bumps in the signal bump region of the substrate.

In accordance with other embodiments, a semiconductor device package includes a first semiconductor device comprising a substrate, an insulating material layer having openings on a surface of the substrate, one or more first insertion bumps disposed over the insulating material layer, and a plurality of signal bumps having portions not disposed over the insulating material layer. The semiconductor device package includes a second semiconductor device coupled to the plurality of signal bumps of the first semiconductor device, the second semiconductor device including one or more second insertion bumps, wherein the one or more of the second insertion bumps is mechanically aligned with the one or more first insertion bumps.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
   forming an insulating material layer over a first substrate;
   removing a first portion of the insulating material layer to expose a contact pad at a top surface of the first substrate;
   forming a first insertion bump over the insulating material layer;
   while forming the first insertion bump, forming a first signal bump extending through the insulating material layer and electrically connected to the contact pad;
   arranging the first signal bump over a second signal bump, wherein the second signal bump is connected to a second substrate, and one or more second insertion bumps are also connected the second substrate, the one or more second insertion bumps at least partially encircling an insertion region;
   physically connecting the first signal bump to the second signal bump; and
   while physically connecting the first signal bump to the second signal bump, inserting the first insertion bump into the insertion region, wherein after the inserting, the one or more second insertion bumps circumferentially surround the first insertion bump at least in part, a first top surface of the first insertion bump is disposed closer to the second substrate than a second top surface of the one or more second insertion bumps, and the second top surface of the one or more second insertion bumps is disposed closer to the first substrate than the first top surface of the first insertion bump.

2. The method according to claim 1, wherein forming the first insertion bump and forming the first signal bump comprises:
patterning a mask to form a first opening over the contact pad on the top surface of the first substrate, and to form one or more second openings over one or more areas of the insulating material layer over which the first insertion bump will be formed;
performing a first plating process with a first conductive material to deposit the first conductive material in the first opening and the one or more second openings; and
removing the mask.

3. The method according to claim 2, further comprising:
before removing the mask, performing a second plating process with a second conductive material to deposit the second conductive material in the first opening of the mask and the one or more second openings of the mask, wherein the second conductive material is different than the first conductive material.

4. The method according to claim 2, further comprising patterning the insulating material layer to remove the insulating material layer outside of the one or more areas of the insulating material layer over which the first insertion bump will be formed.

5. The method according to claim 1, wherein the one or more second insertion bumps comprise at least three second insertion bumps, and after the first signal bump to the second signal bump, the at least three second insertion bumps are each positioned at different locations around the first insertion bump.

6. The method according to claim 5, wherein the first insertion bump and the at least three second insertion bumps are positioned to provide alignment support to the first signal bump and the second signal bump during the physical connection of the first signal bump and the second signal bump.

7. The method according to claim 1, wherein the first insertion bump has a shape of a plug, the one or more second insertion bumps comprises a second insertion bump in a shape of a receptacle, and after the first signal bump to the second signal bump the first insertion bump is inserted into an opening of the second insertion bump.

8. The method according to claim 7, wherein a perimeter of the first insertion bump and a perimeter of the second insertion bump each have a circular shape.

9. The method according to claim 7, wherein a perimeter of the first insertion bump has a circular shape and a perimeter of the second insertion bump has a rectangular shape.

10. The method according to claim 7, wherein the second insertion bump is a continuous conductive structure having an annular shape.

11. The method according to claim 1, wherein sidewalls of the first insertion bump are at least partially free of solder.

12. The method according to claim 1, wherein after inserting the first insertion bump into the insertion region, the first insertion bump is separated from the one or more second insertion bumps by a gap, a width of the gap being up to half a width of the first signal bump.

13. A method comprising:
patterning an opening through an insulating layer over a first substrate;
simultaneously forming a first signal bump in the opening and one or more first conductive features at a top surface of the insulating layer, wherein the first signal bump is electrically connected to a contact pad on the first substrate, and the one or more first conductive features at least partially encircle a region, the one or more first conductive features comprising first sidewalls; and
bonding a second substrate to the first substrate by bonding a second signal bump on the second substrate to the first signal bump, wherein bonding the second substrate to the first substrate comprises inserting a second conductive feature on the second substrate into the region, wherein the one or more first conductive features circumferentially surround the second conductive feature after the second conductive feature is inserted into the region, wherein the second conductive feature comprises second sidewalls, the second sidewalls overlapping with the first sidewalls along a first direction after the second conductive feature is inserted into the region, the first direction extending from the first substrate to the second substrate.

14. The method according to claim 13, wherein patterning the opening through the insulating layer over the first substrate comprises:
removing at least a portion of the insulating layer over the contact pad on the first substrate, wherein after the opening is patterned the insulating layer covers an edge portion of the contact pad and the insulating layer has been removed from a center portion of the contact pad.

15. The method according to claim 13, further comprising forming a plurality of connectors on a surface of the first substrate that is opposite to a side of the first substrate on which the first signal bump is formed.

16. A method comprising:
patterning a first opening and a second opening through a mask layer, wherein the first opening exposes a first portion of a seed layer disposed on a contact pad, the second opening exposes a second portion of the seed layer disposed on an insulating layer, and the first portion of the seed layer and the second portion of the seed layer are disposed at different levels;
simultaneously plating a first conductive pillar on the first portion of the seed layer and a second conductive pillar on the second portion of the seed layer;
disposing a first solder region on the first conductive pillar and a second solder region on the second conductive pillar;
removing the mask layer, wherein after removing the mask layer, the second conductive pillar is an annular structure that completely encircles an area above the insulating layer, the annular structure having an opening exposing the area above the insulating layer;
inserting a third conductive pillar into the opening in the annular structure; and
bonding a fourth conductive pillar to the first conductive pillar, wherein the fourth conductive pillar and the third conductive pillar are disposed on a same substrate.

17. The method according to claim 16, wherein sidewalls of the second conductive pillar or the second solder region adjacent to the area above the insulating layer are tapered.

18. The method according to claim 16, wherein sidewalls of the second conductive pillar or the second solder region adjacent to the area above the insulating layer are parallel to a sidewall of the first conductive pillar.

19. The method according to claim 16, wherein when the third conductive pillar is inserted in the opening in the annular structure, a surface of the third conductive pillar that is closest to the substrate is physically separate from the substrate.

20. The method according to claim 16, wherein sidewalls of the second conductive pillar are at least partially free of solder of the second solder region.

\* \* \* \* \*

UNITED STATES PATENT AND TRADEMARK OFFICE
CERTIFICATE OF CORRECTION

PATENT NO. : 10,818,583 B2  
APPLICATION NO. : 15/714879  
DATED : October 27, 2020  
INVENTOR(S) : I-Ting Chen Page 1 of 1

It is certified that error appears in the above-identified patent and that said Letters Patent is hereby corrected as shown below:

In the Claims

In Column 17, Line 29, Claim 5, delete "and after the first signal bump to the second" and insert --and after the first signal bump is physically connected to the second--.

In Column 17, Line 42, Claim 7, delete "and after the first signal bump to the" and insert --and after the first signal bump is physically connected to the--.

Signed and Sealed this  
Second Day of February, 2021

Drew Hirshfeld  
*Performing the Functions and Duties of the*  
*Under Secretary of Commerce for Intellectual Property and*  
*Director of the United States Patent and Trademark Office*